United States Patent
Yi et al.

(10) Patent No.: US 11,574,679 B2
(45) Date of Patent: Feb. 7, 2023

(54) NEUROMORPHIC MEMORY CIRCUIT AND METHOD OF NEUROGENESIS FOR AN ARTIFICIAL NEURAL NETWORK

(71) Applicant: HRL LABORATORIES, LLC, Malibu, CA (US)

(72) Inventors: Wei Yi, Moorpark, CA (US); Charles Martin, Malibu, CA (US); Soheil Kolouri, Agoura Hills, CA (US); Praveen Pilly, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 0 days.

(21) Appl. No.: 17/736,695

(22) Filed: May 4, 2022

(65) Prior Publication Data

US 2022/0375520 A1 Nov. 24, 2022

Related U.S. Application Data

(60) Provisional application No. 63/185,830, filed on May 7, 2021.

(51) Int. Cl.
*G11C 11/00* (2006.01)
*G11C 13/00* (2006.01)
(Continued)

(52) U.S. Cl.
CPC ........ *G11C 13/0069* (2013.01); *G06F 7/5443* (2013.01); *G11C 7/16* (2013.01);
(Continued)

(58) Field of Classification Search
CPC ....... G11C 13/0069; G11C 7/16; G11C 11/54; G11C 13/0004
(Continued)

(56) References Cited

U.S. PATENT DOCUMENTS

| 8,108,328 B2 | 1/2012 | Hench |
| 9,015,093 B1 | 4/2015 | Commons |

(Continued)

FOREIGN PATENT DOCUMENTS

| CN | 107590534 A | 1/2018 |
| KR | 10-2016-0063965 A | 6/2016 |
| KR | 10-2020-0100302 A | 8/2020 |

OTHER PUBLICATIONS

Aljundi, Rahaf et al., "Memory Aware Synapases: Learning what (not) to forget", arXiv:1711.09601v4 [cs.CV] Oct. 5, 2018 (24 pages).

(Continued)

*Primary Examiner* — Vu A Le
(74) *Attorney, Agent, or Firm* — Lewis Roca Rothgerber Christie LLP

(57) ABSTRACT

A memory circuit configured to perform multiply-accumulate (MAC) operations for performance of an artificial neural network includes a series of synapse cells arranged in a cross-bar array. Each cell includes a memory transistor connected in series with a memristor. The memory circuit also includes input lines connected to the source terminal of the memory transistor in each cell, output lines connected to an output terminal of the memristor in each cell, and programming lines coupled to a gate terminal of the memory transistor in each cell. The memristor of each cell is configured to store a conductance value representative of a synaptic weight of a synapse connected to a neuron in the artificial neural network, and the memory transistor of each cell is configured to store a threshold voltage representative of a synaptic importance value of the synapse connected to the neuron in the artificial neural network.

21 Claims, 23 Drawing Sheets

(51) Int. Cl.
    *G06F 7/544* (2006.01)
    *G11C 11/54* (2006.01)
    *G11C 7/16* (2006.01)
(52) U.S. Cl.
    CPC .......... *G11C 11/54* (2013.01); *G11C 13/0004* (2013.01); *G11C 13/004* (2013.01); *G11C 13/0026* (2013.01); *G11C 13/0028* (2013.01)
(58) Field of Classification Search
    USPC ........................................................ 365/148
    See application file for complete search history.

(56) References Cited

U.S. PATENT DOCUMENTS

| | | |
|---|---|---|
| 9,846,840 B1 | 12/2017 | Lin et al. |
| 10,001,760 B1 | 6/2018 | Hoffman et al. |
| 2003/0200189 A1 | 10/2003 | Meng et al. |
| 2010/0040285 A1 | 2/2010 | Csurka et al. |
| 2015/0106311 A1 | 4/2015 | Birdwell et al. |
| 2016/0140408 A1 | 5/2016 | Shen et al. |
| 2016/0155049 A1 | 6/2016 | Choi |
| 2017/0177993 A1 | 6/2017 | Draelos et al. |
| 2017/0193363 A1 | 7/2017 | Lee |
| 2017/0200274 A1 | 7/2017 | Tan et al. |
| 2017/0251081 A1 | 8/2017 | Roychowdhury et al. |
| 2017/0344884 A1 | 11/2017 | Lin et al. |
| 2018/0032868 A1 | 2/2018 | Dani et al. |
| 2018/0247160 A1 | 8/2018 | Rohani et al. |
| 2019/0034788 A1* | 1/2019 | Burr ..................... G06N 3/084 |
| 2019/0108436 A1 | 4/2019 | David et al. |
| 2019/0114511 A1 | 4/2019 | Gao et al. |
| 2019/0122113 A1 | 4/2019 | Chen et al. |
| 2019/0279089 A1 | 9/2019 | Wang |
| 2019/0392268 A1 | 12/2019 | Tariq et al. |
| 2020/0026997 A1 | 1/2020 | Yang |
| 2020/0050928 A1* | 2/2020 | Narayanan ............ G06N 3/049 |
| 2020/0125930 A1 | 4/2020 | Martin et al. |
| 2020/0133273 A1 | 4/2020 | Skorheim et al. |
| 2020/0265307 A1 | 8/2020 | Suh |
| 2020/0320400 A1 | 10/2020 | David |
| 2020/0410365 A1 | 12/2020 | Cheung et al. |
| 2021/0021866 A1 | 1/2021 | Djokovic et al. |
| 2021/0027098 A1 | 1/2021 | Ge et al. |
| 2021/0034840 A1 | 2/2021 | Fan et al. |

OTHER PUBLICATIONS

International Search Report and Written Opinion for corresponding International Patent Application No. PCT/US2022/027657, dated Aug. 12, 2022 (9 pages).

Aljundi et al., "Memory Aware Synapses: Learning what (not) to forget," arXiv:1711.09601v4, 24 pages, Oct. 2018.

Draelos, Timothy J., et al. "Neurogenesis deep learning: Extending deep networks to accommodate new classes." 2017 International Joint Conference on Neural Networks (IJCN N). IEEE, 2017: 526-533 (Year: 2017).

International Search Report and Written Opinion for Application No. PCT/US2019/049726, dated Dec. 26, 2019, 9 pages.

Karras, Tero, et al. "Progressive growing of gans for improved quality, stability, and variation." arXiv preprint arXiv: 1710.10196 ( 2017): 1-26 (Year: 2017).

Kirkpatrick et al., "Overcoming catastrophic forgetting in neural networks," PNAS, 114(13): 3521-3526, Mar. 2017.

Kolouri et al., "Sliced-Wasserstein Auto-Encoders," ICLR, 19 pages, 2019.

Kolouri, Soheil, Charles E. Martin, and Heiko Hoffmann. "Explaining Distributed Neural Activations via Unsupervised Learning." 2017 IEEE Conference on Computer Vision and Pattern Recognition Workshops (CVPRW). IEEE, Jul. 2017: 1670-1678 (Year: 2017).

Kolouri, Soheil, et al. "Sliced-Wasserstein Autoencoder: An Embarrassingly Simple Generative Model." arXiv preprint arXiv: 1804. 01947 (Jun. 27, 2018): 1-25 (Year: 2018).

Kolouri, Soheil, Yang Zou, and Gustavo K. Rohde. "Sliced Wasserstein kernels for probability distributions." Proceedings of the IEEE Conference on Computer Vision and Pattern Recognition. 2016: 5258-5267 (Year: 2016).

Liutkus, Antoine, et al. "Sliced-Wasserstein Flows: Nonparametric Generative Modeling via Optimal Transport and Diffusions." arXiv preprint arXiv: 1806.08141 (Jun. 2018): 1-27 (Year: 2018).

Martin, Charles E. Adapting swarm intelligence for the self-assembly and optimization of networks. Diss. 2011: i-218 (Year: 2011).

Martin, Charles E., and James A. Reggia. "Fusing swarm intelligence and self-assembly for optimizing echo state networks." Computational intelligence and neuroscience 2015: 1-15 (Year: 2015).

Martin, Charles E., and James A. Reggia. "Self-assembly of neural networks viewed as swarm intelligence." Swarm Intelligence 4.1 (2010): 1-36. (Year: 2010).

Mocanu, Decebal Constantin, et al. "Scalable training of artificial neural networks with adaptive sparse connectivity inspired by network science." Nature communications 9.1 (Jun. 19, 2018): 1-12. (Year: 2018).

Parisi et al., "Continual Lifelong Learning with Neural Networks: A Review," arXiv: 1802.07569v4, 29 pages, Feb. 2019.

Razavian et al., "CNN Features off-the-shelf: an Astounding Baseline for Recognition," Proceedings in the IEEE conference on computer vision and pattern recognition workshops, pp. 806-813, 2014.

Rostami et al., "Complementary Learning for Overcoming Catastrophic Forgetting Using Experience Replay," arXiv:1903. 04566v2, 8 pages, Mar. 31, 2019.

Rusu et al., "Progressive Neural Networks," arXiv:1606.04671v3, 14 pages, Sep. 2016.

Yoon et al., "Lifelong Learning with Dynamically Expandable Networks," ICLR, 11 pages, 2018.

Zenke et al., "Continual Learning Through Synaptic Intelligence," Proceedings of the 34th International Conference on Machine Learning, 9 pages, 2017.

Zhang et al., "Top-Down Neural Attention by Excitation Backprop," International Journal of Computer Vision, 126:1084-1102. 2018.

* cited by examiner

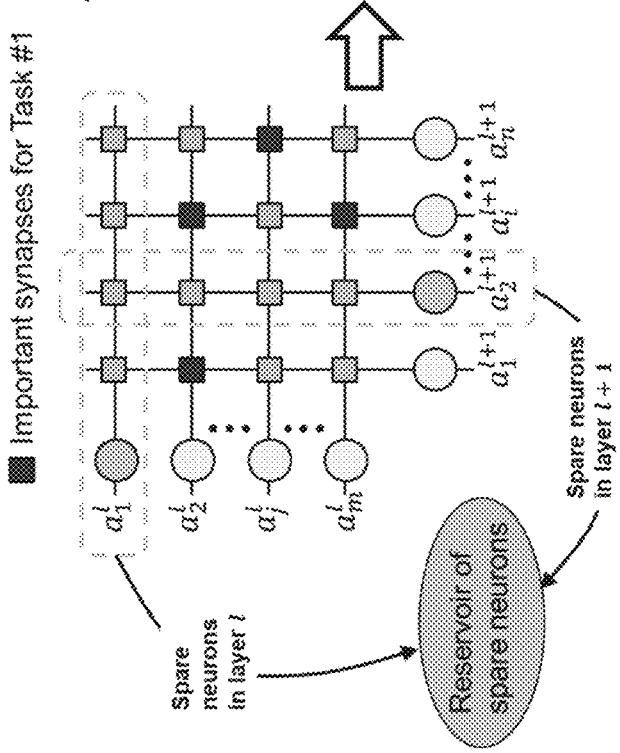
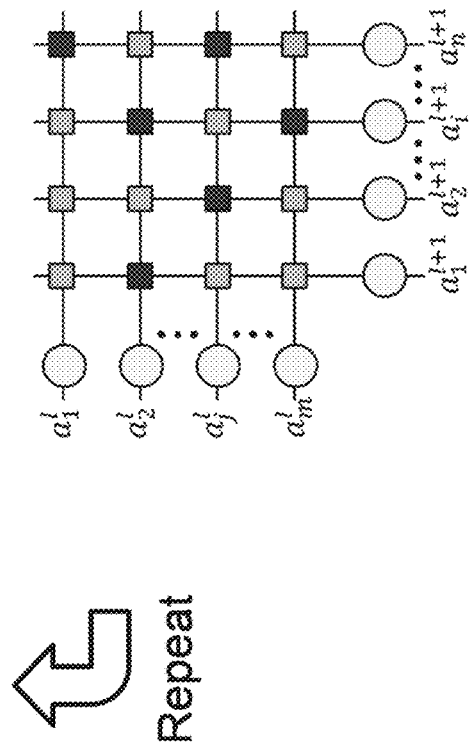
FIG. 22

NEUROMORPHIC MEMORY CIRCUIT AND METHOD OF NEUROGENESIS FOR AN ARTIFICIAL NEURAL NETWORK

CROSS-REFERENCE TO RELATED APPLICATION(S)

This application claims priority to and the benefit of U.S. Provisional Application No. 63/185,830, filed May 7, 2021, the entire contents of which are incorporated herein by reference. This application is related to U.S. application Ser. No. 16/561,735 (which issued as U.S. Pat. No. 11,113,597), filed Sep. 5, 2019, which claims priority to and the benefit of U.S. Provisional Patent Application No. 62/750,155, filed Oct. 24, 2018, and U.S. Provisional Patent Application No. 62/749,617, filed Oct. 23, 2018, the entire contents of all of which are incorporated herein by reference. This application is also related to U.S. application Ser. No. 16/549,784 (which issued as U.S. Pat. No. 11,210,559 on Dec. 28, 2021), filed Aug. 23, 2019, which claims priority to and the benefit of U.S. Provisional Application No. 62/749,821, filed Oct. 24, 2018, and U.S. Provisional Application No. 62/749,540, filed Oct. 23, 2018, the entire contents of all of which are incorporated herein by reference.

BACKGROUND

1. Field

The present disclosure relates generally to neuromorphic memory circuits and methods of training artificial neural networks.

2. Description of Related Art

Artificial neural networks are utilized in a variety of fields and applications to perform various tasks, such as character recognition, image classification, natural language processing, and various pattern matching and classification tasks. Artificial neural networks include an input layer, at least one hidden layer, and an output layer, each having a population of neurons or nodes. Outputs of the neurons in one layer are connected to inputs of the neurons in the succeeding layer, and a "weight" is associated with each connection between neurons. To compute the activation state of each neuron, a weighted sum of the inputs to the neurons is performed (i.e., a multiplication of a set of input signals by a set of weights, followed by a summation) and then the linear combination of the weighted inputs is transferred into a thresholding activation function (f(S)) with a transfer function.

SUMMARY

The present disclosure relates to various embodiments of a memory circuit configured to perform multiply-accumulate (MAC) operations for performance of an artificial neural network. In one embodiment, the memory circuit includes a series of cells arranged in a cross-bar array, each cell of the series of cells including a memory transistor connected in series with a memristor, a series of input lines (bit lines) connected to a source terminal of the memory transistor in each cell, a series of output lines (plate lines) connected to an output terminal of the memristor in each cell, and a series of programming lines (word lines) coupled to a gate terminal of the memory transistor in each cell. The memristor of each cell is configured to store a conductance value representative of a synaptic weight of a synapse connected to a neuron in the artificial neural network. The memory transistor of each cell is configured to store a threshold voltage representative of a synaptic importance value of the synapse connected to the neuron in the artificial neural network. For each cell of the series of cells, the conductance value of the memristor and the threshold voltage of the memory transistor are independently programmable.

The memristor in each cell of the series of cells may be a resistive random access memory (ReRAM) element, a phase-change memory (PCM) element, a ferroelectric tunnel junction (FTJ) element, or a spin-transfer torque memory (STT-RAM) element.

The memory transistor in each cell of the series of cells may be a ferroelectric field-effect transistor (FeFET) or a charge trap transistor (CTT).

The memory circuit may also include a word line driver coupled to the series of word lines, a bit line driver coupled to the series of input lines, and an output driver coupled to the series of output lines.

The memory circuit may also include a current sensing element coupled to the cross-bar array. The current sensing element may include sample and hold amplifiers or transimpedance amplifiers.

The memory circuit may include a multiplexer coupled to the current sensing element and a multiplexer controller coupled to the multiplexer.

The memory circuit may also include a series of analog-to-digital converters coupled to the multiplexer.

The memory circuit may include a series of adders and a series of shift registers coupled to the series of analog-to-digital converters. These peripheral circuits are made of CMOS.

The present disclosure also relates to various embodiments of a method of programming a memory circuit. In one embodiment, the method includes changing the conductance value, representative of the synaptic weight, of the memristor in at least one cell of the series of cells during training of the artificial neural network on a first task, determining, with a circuit separate from the memory circuit, at least one important synapse of the artificial neural network for performing the first task, changing the threshold voltage, representative of the synaptic importance value, of the memory transistor in at least one cell of the series of cells, the at least one cell corresponding to the at least one important synapse of the artificial neural network for performing the first task.

Changing the threshold voltage may include applying a programming pulse across the gate terminal and the source terminal of the memory transistor in the at least one cell while keeping the input lines and the output lines at the same voltage (applying no voltage or applying the same voltage) to avoid any change in the synaptic weights stored in memristor elements. In an embodiment of a FeFET, its threshold voltage can be adjusted by changing the remnant polarization of the ferroelectric gate dielectric layer using the said programming pulse method. Such a change in the remnant polarization of ferroelectric material is nonvolatile and is memorized after the removal of the programming pulse.

The method may include changing the conductance value, representative of the synaptic weight, of the memristor of at least one cell of the series of cells during training the artificial neural network on a second task different than the first task. Changing the synaptic weight of a selected memristor element may include applying a programming pulse across the input line (the source terminal of the memory transistor in series with the memristor) and the output line of the selected memristor element. A suprathreshold voltage is applied to the gate terminal of the memory transistor so that it is switched to "On" state with a small source-drain resistance to allow the programming pulse to be applied across the selected memristor element.

The threshold voltage of the memory transistor of at least one cell is configured to prevent the changing of the weight value of the at least one cell during the training of the artificial neural network on the second task to prevent the neural network from exhibiting catastrophic forgetting. In one embodiment, an n-channel FeFET (n-FeFET) is used as the memory transistor. Shifting its threshold voltage toward a more positive value would decrease the source-drain current at the same source-drain and source-gate bias condition. A higher synaptic importance corresponds to a more positive threshold voltage, which makes it less likely for the FeFET to be turned into "On" state during the training in a second task, thus protecting the conductance (synaptic weight) of the memristor element connected in series from been changed.

The cross-bar memory circuit may be co-integrated with CMOS circuitry within the same CMOS processing core, or hetero-integrated onto a prefabricated CMOS processing core.

The determination of important synapses of the artificial neural network may include identifying, utilizing a contrastive excitation backpropagation algorithm, important neurons within all the layers for the first task, and identifying, utilizing a learning algorithm, important synapses between the plurality of neurons for the first task based on the important neurons identified.

The learning algorithm to identify important synapses may be a Hebbian learning algorithm as follows: $\beta_{ji}^{l'}=\beta_{ji}^{l}+P(a_j^l(x_n))P(a_i^{l+1}(x_n))$, where $\beta_{ji}^l$ is a synaptic importance parameter, $x_n$ is an input image, $a_j^l$ is a j'th neuron in layer l of the artificial neural network, $a_i^{l+1}$ is an i'th neuron in layer l+1 of the artificial neural network, and P is a probability.

The learning algorithm to identify important synapses may be Oja's learning rule as follows: $\gamma_{ji}^{l'}=\gamma_{ji}^l+\in(P_c(f_j^{(l-1)})P_c(f_j^l)-P_c(f_i^l)^2\gamma_{ji}^l)$ where i and j are neurons, l is a layer of the artificial neural network, $P_c$ is a probability, $\gamma_{ji}^l$ is the importance of the synapse between the $j^{th}$ neuron in layer l−1 and $i^{th}$ neuron in layer l for the first task, $\in$ is the rate of Oja's learning rule, and $P_c$ is a probability.

The present disclosure also relates to various embodiments of a method of performing neurogenesis of an artificial neural network including a number (or population) of layers and a number (or population) of neurons in each layer of the population of layers. In one embodiment, the method includes determining a series of spare neurons of the artificial neural network, evaluating performance of the artificial neural network at a new task or context, determining a number and locations of additional neurons of the series of spare neurons to add to the artificial neural network in response to the performance of the artificial neural network stagnating or declining, connecting the additional neurons to the artificial neural network with additional synapses, training the artificial neural network with the additional neurons and the additional synapses on the new task or context to determine weights and synaptic importance values of the additional synapses, and storing the weights and the synaptic importance values of the spare neurons in a memory circuit.

Determining the spare neurons may include training the artificial neural network on a first task or context to determine weights of synapses connecting the plurality of neurons, determining synaptic importance values of the synapses, and determining that the synaptic importance value for each synapse connected to at least one neuron of the series of neurons is below a synaptic importance threshold.

The synaptic importance threshold may be determined according to the following equation: $\gamma_i$<Mean($\gamma_i$)−3Std. Dev. ($\gamma_i$), wherein $\gamma_i$ is the synaptic importance of the synapses connected to the plurality of neurons in layer i of the artificial neural network.

Determining the spare neurons may include actively setting the spare neurons inactive.

Determining the number and the locations of the additional neurons may utilize a probabilistic program neurogenesis (PPN) algorithm executed on a commercial off-the-shelf (COTS) chip separate from the memory circuit.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device or method.

BRIEF DESCRIPTION OF THE DRAWINGS

The features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

FIGS. 17-18A are schematic views of a neuromorphic memory circuit according to one embodiment of the present disclosure;

FIG. 22 is a schematic view of a task of utilizing PPN to identify which "spare" neurons to add to the artificial neural network according to one embodiment of the present disclosure.

DETAILED DESCRIPTION

Figure 1:
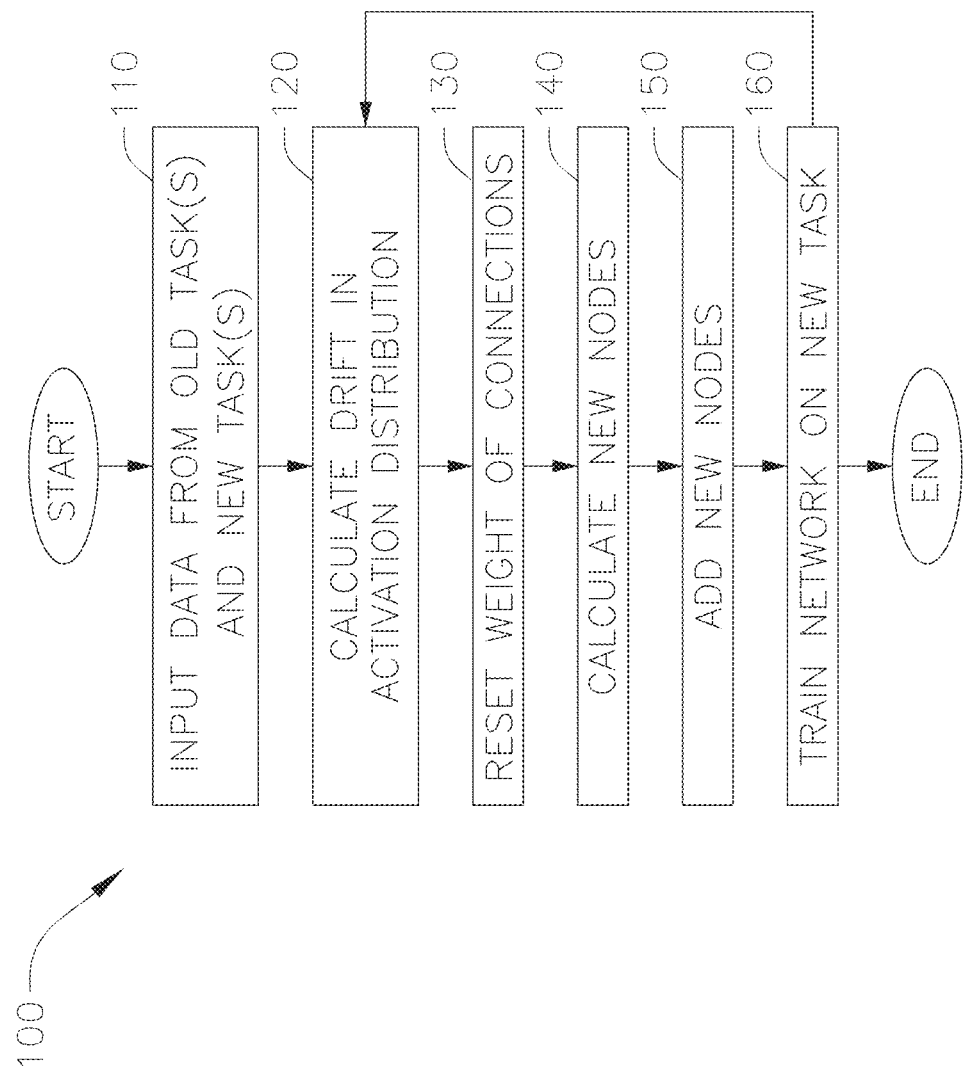
FIG. 1 is a flowchart illustrating tasks of a method of training an artificial neural network according to one embodiment of the present disclosure.

The present disclosure is directed to various embodiments of a method of training an artificial neural network, which has already been trained on data from one or more old tasks, on data from one or more new tasks. In one or more embodiments, the methods of the present disclosure utilize epigenetic neurogenesis, which includes adding new nodes and connections to the artificial neural network to enable learning of one or more new tasks without performance degradation or substantially without performance degradation of the previously learned tasks (i.e., without catastrophic forgetting of the one or more old tasks that the artificial neural network was trained to perform). Additionally, the method of the present disclosure is configured to integrate the knowledge acquired on the one or more olds tasks with new information to improve performance of the new task with fewer training examples by training both the old and new connections. Furthermore, the methods of the present disclosure are configured to minimize the number of new nodes and connections added to the artificial neural network while achieving performance targets on the one or more new tasks (i.e., the method is configured to minimize the increase in the size and complexity of the artificial neural network necessary to achieve performance targets for the one or more new tasks).

The method of training an artificial neural network with epigenetic neurogenesis according to the present disclosure may be utilized, for instance, in any autonomous or semi-autonomous system that may encounter new tasks to learn and may also be required to revisit old tasks without requiring retraining of the artificial neural network on the old tasks. For example, the methods of the present disclosure may be utilized to enable continual learning in smart aircraft or smart vehicle components that store information, such as sensor and maintenance data, on the components themselves and that are configured to learn a model that can generate realistic synthetic data as needed. The method of training an artificial neural network with epigenetic neurogenesis according to the present disclosure may enable continual learning of these smart components due to changing environmental conditions, changing aircraft/vehicle configurations, and/or the component being placed on different aircrafts or different vehicles over its lifetime. The method of training an artificial neural network with epigenetic neurogenesis according to the present disclosure may also enable, for example, a single aircraft or vehicle visual perception system (e.g., object classification, lane marking detection, and/or drivable surface identification) to be utilized across many diverse aircraft or vehicles because this requires continual learning without forgetting such that the perception system can handle many different environments, models, and model-years. When the methods of the present disclosure are utilized to enable continual learning of an aircraft or vehicle visual perception system, data can be uploaded from the aircraft or the vehicles to remote servers where learning and testing occurs, and then software updates to the perception system can be pushed to the aircraft or the vehicles directly.

Embodiments of the present disclosure are also directed to various embodiments of artificial neural networks and methods of training artificial neural networks utilizing selective plasticity such that the artificial neural network can learn new tasks (e.g., road detection during nighttime) without forgetting old tasks (e.g., road detection during daytime). The selective plasticity of the present disclosure is achieved by utilizing the c-EBP framework, which is an attentional mechanism, that identifies neurons that are significant for solving a particular task, and by utilizing Oja's learning rule to rigidify the synaptic connections between these significant neurons such that the rigidified synaptic connections do not change during learning of a new task. In this manner, the artificial neural networks of the present disclosure utilize selective plasticity of the synapses to maintain previously learned tasks while learning new tasks and thereby effectively accumulate new knowledge. That is, the artificial neural networks of the present disclosure utilize selective plasticity to learn new tasks without suffering from catastrophic forgetting, which occurs with related art artificial neural networks that employ uniform plasticity of the synapses.

Embodiments of the present disclosure are further directed to a neuromorphic memory circuit configured to perform multiply-accumulate (MAC) operations for an artificial neural network. The neuromorphic memory circuit has a series of cells arranged in a cross-bar array, and each cell includes a memory transistor connected in series to a memristor. The memristor is configured to store, in non-volatile memory, a conductance value representative of a synaptic weight of a synapse connecting two neurons in adjacent layers of the artificial neural network, and the memory transistor is configured to store, in non-volatile memory, a threshold voltage representative of a synaptic importance of the synapse for performing a particular task.

Figure 2:
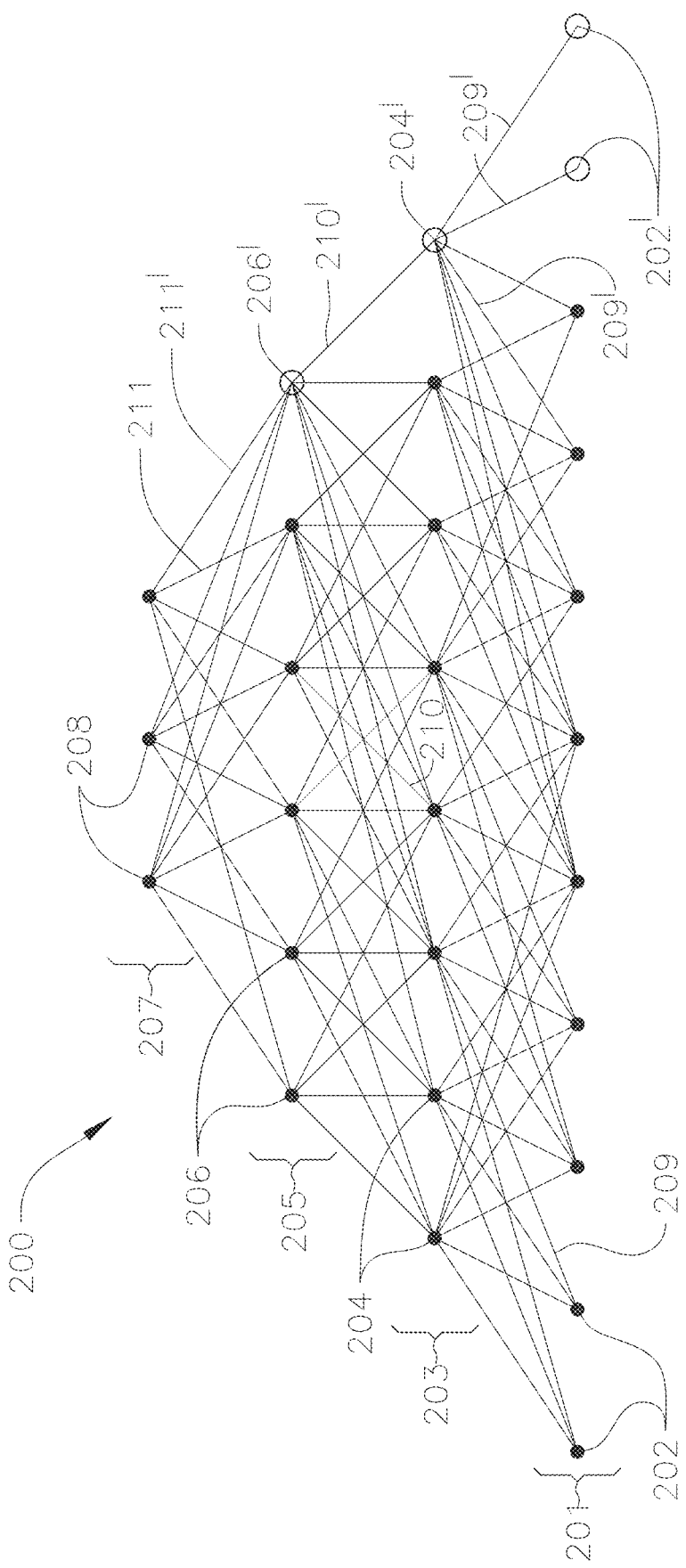
FIG. 2 is schematic view of an artificial neural network being trained according to the method of FIG. 1.

FIG. 1 is a flowchart illustrating tasks of a method 100 of training an artificial neural network (ANN) 200, which has been trained on data from one or more old tasks, on data from one or more new tasks, and FIG. 2 is a schematic view of the artificial neural network 200 being trained according to the method 100 illustrated in FIG. 1. In one or more embodiments, the artificial neural network 200 includes an input layer 201 having a series of input layer nodes 202, a first hidden layer 203 having a series of first hidden layer nodes 204, a second hidden layer 205 having a series of second hidden layer nodes 206, and an output layer 207 having a series of output layer nodes 208. In the illustrated embodiment, a series of connections 209 connect each of the input layer nodes 202 in the input layer 201 to each of the first hidden layer nodes 204 in the first hidden layer 203, a series of connections 210 connect each of the first hidden layer nodes 204 in the first hidden layer 203 to each of the second hidden layer nodes 206 in the second hidden layer 205, and a series of connections 211 connect each of the second hidden layer nodes 206 in the second hidden layer 205 to each of the output layer nodes 208 in the output layer 207. Moreover, each of the connections 209, 210, 211 between the nodes in adjacent layers have an associated connection weight. Additionally, each of the nodes 202, 204, 206, 208 in the artificial neural network 200 is associated with an activation function configured to receive the inputs to the nodes 202, 204, 206, 208 as arguments to the activation function and compute an output value for the nodes 202, 204, 206, 208 based on the inputs to determine the activation states of the nodes 202, 204, 206, 208. Although in the illustrated embodiment the artificial neural network 200 includes two hidden layers 203, 205, in one or more embodiments, the artificial neural network 200 may include any other suitable number of hidden layers and each layer may have any suitable number of nodes depending, for instance, on the desired complexity of the task that the artificial neural network is capable of learning and performing. Furthermore, although in the illustrated embodiment the artificial neural network 200 is a fully-connected artificial neural network (i.e., each node is connected to each node in the adjacent layer), in one or more embodiments, the artificial neural network 200 may not be fully connected.

In the illustrated embodiment, the method 100 includes a task 110 of inputting data from the one or more old tasks that the artificial neural network 200 has been trained to perform, as well as data from one or more new tasks that the artificial neural network 200 will be trained to perform, into the input layer 201 of the artificial neural network 200. The data from the one or more old tasks may be real data or synthetic data. For instance, the data from the one or more old tasks may include an amount of training data (e.g., 5%) that has been retained from the input and target output distributions of the one or more old tasks. In one or more embodiments, the data from the one or more old tasks may be synthetic data generated from a model of the input and target output distributions of the one or more old tasks.

In the illustrated embodiment, the method 100 includes also a task 120 of calculating, as the artificial neural network 200 is trained on data from the one or more new tasks according to task 110, a drift in activation distributions of the nodes 204, 206 in the one or more hidden layers 203, 205 with respect to data from the one or more old tasks that the artificial neural network 200 was trained to perform. In an embodiment in which the artificial neural network 200 includes two hidden layers 203, 205, the task 120 of calculating the drift includes calculating the probability distributions $P_{Z1}(Z1|X1)$ and $P_{Z2}(Z2|X1)$ after training the artificial neural network 200 on the old tasks has completed, but before training on a new task begins, where X1 is input data for the old task, Z1 is the activations of the nodes 204 in the first hidden layer 203, and Z2 is the activations of the nodes 206 in the second hidden layer 205. Z1 and Z2 refer to the activations of only the nodes present during training on the old tasks, before a subsequent task of adding one or more nodes to one or more of the hidden layers 203, 205. In one or more embodiments, the task 120 utilizes samples only from the probability distributions $P_{Z1}(Z1|X1)$ and $P_{Z2}(Z2|X1)$, and therefore the task 120 does not require closed-form expressions for the probability distributions, which may be, or may approximately be, Gaussian functions (e.g., the task 120 does not need to estimate closed form expressions for these distributions, such as Gaussians). The task 120 of calculating the drift also includes calculating $\hat{P}_{Z1}(Z1|X1)$ and $\hat{P}_{Z2}(Z2|X1)$ once training of the artificial neural network 200 has begun on a new task. $\hat{P}_{Z1}(Z1|X1)$ and $\hat{P}_{Z2}(Z2|X1)$ are the data distributions in the first and second hidden layers 203, 205, respectively, after training on the new task has begun. In one or more embodiments, $\hat{P}_{Z1}(Z1|X1)$ and $\hat{P}_{Z2}(Z2|X1)$ are determined automatically by changes to the weights in the network that occur as a result of training on the new task. In one or more embodiments, task 120 includes sampling only from this distribution to compute SWD, not a closed-form expression. Additionally, $\hat{P}_{Y1}$ is the target distribution for the first task that the network is trying to learn to map the first task input to $P_{X1}$, and $\hat{P}_{Y2}$ is the target distribution for the first task that the network is trying to learn to map the first task input to $P_{X2}$. The target distributions are defined a priori by the user.

Figure 3:
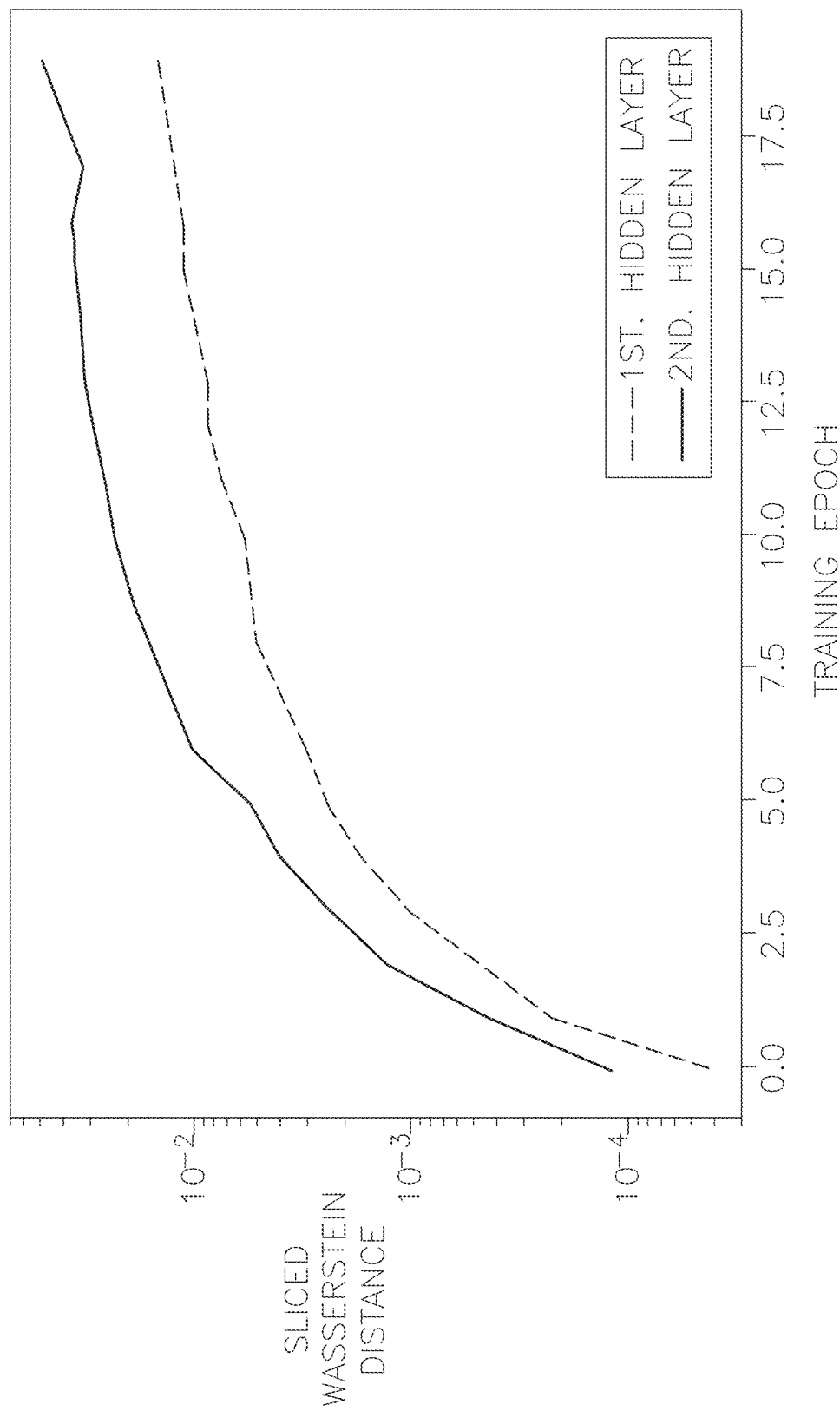
FIG. 3 is a graph depicting drift in the activation distributions of hidden layers of the artificial neural network, calculated with Sliced Wasserstein Distance, according to one task of the method illustrated in FIG. 1.

The task 120 then includes determining the drift from the probability distributions $P_{Z1}(Z1|X1)$ and $P_{Z2}(Z2|X1)$ utilizing the Sliced Wasserstein Distance (SWD), which is an estimate of the Wasserstein Distance between probability distributions (i.e., the task 120 utilizes SWD to directly measure changes in the activity distributions within different layers of the artificial neural network, which provides a clear signal of information loss and gain and thereby provides a metric for determining when, where, and how many nodes to add to artificial neural network). In one or more embodiments, the task 120 utilizes only samples from the probability distributions $P_{Z1}(Z1|X1)$ and $P_{Z2}(Z2|X1)$ to compute the SWD. SWD is described in more detail in S. Kolouri, P. E. Pope, C. E. Martin, and G. K. Rohde, "Sliced-Wasserstein Auto-Encoders," International Conference on Learning Representations (ICLR 2019), New Orleans, La., US, May 6-May 9, 2019, the entire content of which is incorporated herein by reference. FIG. 3 is a graph illustrating the drift in the activation distributions of the nodes 204, 206 in the hidden layers 203, 205 as training progresses on the new task. Although some drift may be acceptable, too much drift may be a problem because it indicates that the parent network is forgetting how to solve the old task (Task 1). As described below, the purpose of the SWD term in the loss function (Equation 2) is to limit the amount of drift when learning a new task, and the user-specified parameter in Equation 2 controls how much drift is allowed. In one embodiment, the method includes training the artificial neural network 200 on the new task data drawn from $P_{X2}(X2)$, where X2 is input data for the new task, for N steps (which is any natural number) and then computing the drifts $D1=SWD(P_{Z1}, \hat{P}_{Z1})$ and $D2=SWD(P_{Z2}, \hat{P}_{Z2})$, where D1 measures the drift in $P_{Z1}$ and D2 measures the drift in $P_{Z2}$ after N steps of training on the new task. Although the above-described tasks are described with reference to an artificial neural network having two hidden layers, it will be apparent to a person having ordinary skill in the art how to adapt the above-described tasks to an artificial neural network having any other number of hidden layers, such as a single hidden layer or three or more hidden layers.

Additionally, in the illustrated embodiment, after the task 120 of calculating the drifts D1 and D2, the method 100 includes a task 130 of resetting the weights of the connections 209, 210, 211 between the nodes 202, 204, 206, 208 to the values they had before training the artificial neural network 200 on the new task began. The purpose of allowing the weights to change initially is to enable calculation, in task 120, of the drifts (D1, D2, DN) in activation distributions of the nodes.

The method 100 also includes a task 140 of calculating, based on the drifts D1 and D2 calculated in task 120, the number of nodes, if any, to add to one or more of the hidden layers 203, 205 of the artificial neural network 200. This task 140 is performed utilizing a function, F(D), that maps the drift D determined by SWD in task 120, to the number of nodes, $N_{nodes}$, to add to a hidden layer 203, 205. In one or more embodiments, the function F(D) is restricted to the range [0, M], where M is a user-specified upper-bound on the number of new nodes, $N_{nodes}$, that can be added to a hidden layer, and the function F(D) is a monotonic increasing function. In one or more embodiments, the function for calculating the number of new nodes to add to a hidden layer is as follows:

$$N_{nodes} = c*\log(D) + b \quad \text{(Equation 1)}$$

where D is the drift calculated by SWD in task 120 and b and c are user-specified parameters. The user-specified parameters b and c are application-specific, and therefore the user-specified parameters b and c may be any values suitable for the intended application of the method 100 and the artificial neural network 200. Additionally, in one or more embodiments, the task 140 of calculating the number of nodes to add to a hidden layer 203, 205 includes rounding the output of the function F(D) to the nearest natural number. In one or more embodiments, the function F(D) for mapping the drift to the number of new nodes to add to a hidden layer may have any other suitable form specified by the user, depending, for instance, on the nature of the new task the artificial neural network 200 is being trained to learn.

In the illustrated embodiment, the method 100 also includes a task 150 of adding the new nodes, which were calculated in task 140, to the one or more hidden layers 203, 205 and/or the input layer 201 of the artificial neural network 200. FIG. 2 shows an example in which the task 150 includes adding two new nodes 202' to the input layer 201, adding one node 204' to the first hidden layer 203, and adding one node 206' to the second hidden layer 205. In one or more embodiments, the task 150 may include adding any other suitable number of nodes to the layers of the artificial neural network 200, depending, for instance, on the nature of the new task that the artificial neural network is being trained to learn. Additionally, in one or more embodiments, the method 100 may include a task of adding a new output layer having a series of new output layer nodes to the artificial neural network 200. In one or more embodiments, the method 100 may include the task of adding the new output layer to the artificial neural network 200 only if the new task requires identifying new types of classes or the new target output distribution is significantly different from the target output distribution on the old tasks.

Additionally, in the illustrated embodiment, the task 150 of adding the new nodes 202', 204', 206' includes connecting the new nodes 202', 204', 206' according to the following scheme: (i) each new node added to hidden layer L (or to the input layer 201) is connected to each of the new nodes added to hidden layer L+1 (or the first hidden layer L with respect to the new node(s) added to the input layer 201), if such new nodes are added (e.g., the new node 204' added to the first hidden layer 203 is connected to the new node 206' added to the second hidden layer 205); (ii) if a new output layer is added and new nodes are added to the last hidden layer (i.e., the hidden layer adjacent to the output layer), each new node added to the last hidden layer connects only to the nodes in the new output layer; (iii) if a new output layer is not added and new nodes are added to the last hidden layer (i.e., the hidden layer adjacent to the output layer), each new node added to the last hidden layer connects only to the nodes in the old output layer; (iv) the new nodes added to one or more of the hidden layers are not connected to the old nodes in the one or more hidden layers (e.g., the new nodes 204' added to the first hidden layer 203 are not connected to the old nodes 206 in the second hidden layer 205); (v) the old nodes in hidden layer L are connected to the new nodes in hidden layer L+1, if such nodes are added (e.g., the old nodes 204 in the first hidden layer 203 are connected to the new nodes 206' added to the second hidden layer 205); (vi) input layer nodes are connected to the new nodes added to the first hidden layer, if such nodes are added (e.g., the input layer nodes 202 are connected to the new nodes 204' added to the first hidden layer 203); and (vii) the weights of the new connections are assigned random values from a pre-defined distribution (e.g., uniform or Gaussian).

In the illustrated embodiment, the method 100 also includes a task 160 of training the artificial neural network 200 on data from the new task after the new nodes 202', 204', 206' have been added to the one or more hidden layers of the artificial neural network 200 and the connections to and from the new nodes 202', 204', 206' have been made in accordance with the scheme described above. In one or more embodiments, the task 160 of training the artificial neural network 200 includes minimizing the following loss function using stochastic gradient descent:

$$\text{Loss} = \min_{\theta,\psi} D(P_{Y_2}, \hat{P}_{Y_2}) + D(P_{Y_1}, \hat{P}_{Y_1}) + \lambda \Sigma_i SWD(P_{Z_i}, \hat{P}_{Z_i}) \quad \text{(Equation 2)}$$

where Y1 is the target output of the artificial neural network for the old task, Y2 is the target output of the artificial neural network for the new task, θ are the network weights on the connections 209, 210, 211 between the nodes 202, 204, 206 that were present during learning of the old tasks (i.e., before the new nodes 202', 204', 206' were added), and are the weights on the newly added connections 209', 210' 211' (e.g., the weights on the newly added connections to and from the new nodes added to the one or more hidden layers and/or to the nodes in the new output layer). The task 160 of training the artificial neural network 200 on data from the new task includes training both old weights (θ) and new weights (ψ) when learning a new task. The first term in the loss function (Equation 2) is a distance measurement D between the target output distribution for the new task $\hat{P}_{Y_2}$ and the network output conditioned on input data from the new task $P_{Y_2}$. In one or more embodiments, the distance measurement D for classification tasks may be the cross-entropy and for regression tasks the distance measurement D may be the mean squared error (MSE). The distance measurement D term allows the artificial neural network 200 to learn the target input-output mapping for the new task. The second term in the loss function (Equation 2) involves the same distance measurement D, but it is between the target output distribution on the old task(s) $\hat{P}_{Y_1}$ and the network output conditioned on the old task(s) $P_{Y_1}$. The second term of the loss function helps prevent the artificial neural network from forgetting the target input-output mapping for the old task(s) while the new task is being learned. In one or more embodiments, the loss function (Equation 2) may not include the second term (e.g., the second term of the loss function is optional and may not be included if, for instance, a new output layer has been added to the artificial neural network 200). In one or more embodiments, the loss function (Equation 2) may include the second distance measurement term when a new output layer has been added to the artificial neural network 200 and data from the target distribution $\hat{P}_{Y_j}$ is available. The third term of the loss function (Equation 2) not only helps prevent catastrophic forgetting of old tasks, but also enables some drift in the hidden distributions, which promotes integration of information from old and new tasks, thus reducing the required size of the artificial neural network 200 (i.e., minimizing or at least reducing the number of nodes and connections) for a given performance level. The user-specified coefficient $\lambda$ controls the trade-off between maintaining performance on old tasks versus having smaller networks that perform well on the new task. Larger values of $\lambda$ limit drift in the hidden distributions, thus preserving performance on old tasks, but achieving a given performance level on the new task requires the addition of a greater number of new nodes. On the other hand, smaller values of $\lambda$ permit larger drift, thus allowing smaller networks, but some performance on old tasks will be sacrificed. In one or more embodiments, the value for $\lambda$ may be set in a range from 1.0 to 10.0, although the value of $\lambda$ may be any other value suitable for the new task the artificial neural network is learning.

During the task 160 of training the artificial neural network 200 on the new task, the performance gains/losses are monitored. If after a user-specified number of training epochs the performance has not reached a user-specified target, then the method 100 may include a task of adding additional nodes to the artificial neural network 200. The limit on the number of training epochs may be set, for instance, based on computational resources and/or time constraints, and the performance target may be set based on the specific application for which the artificial neural network 200 is being utilized.

Figure 4:
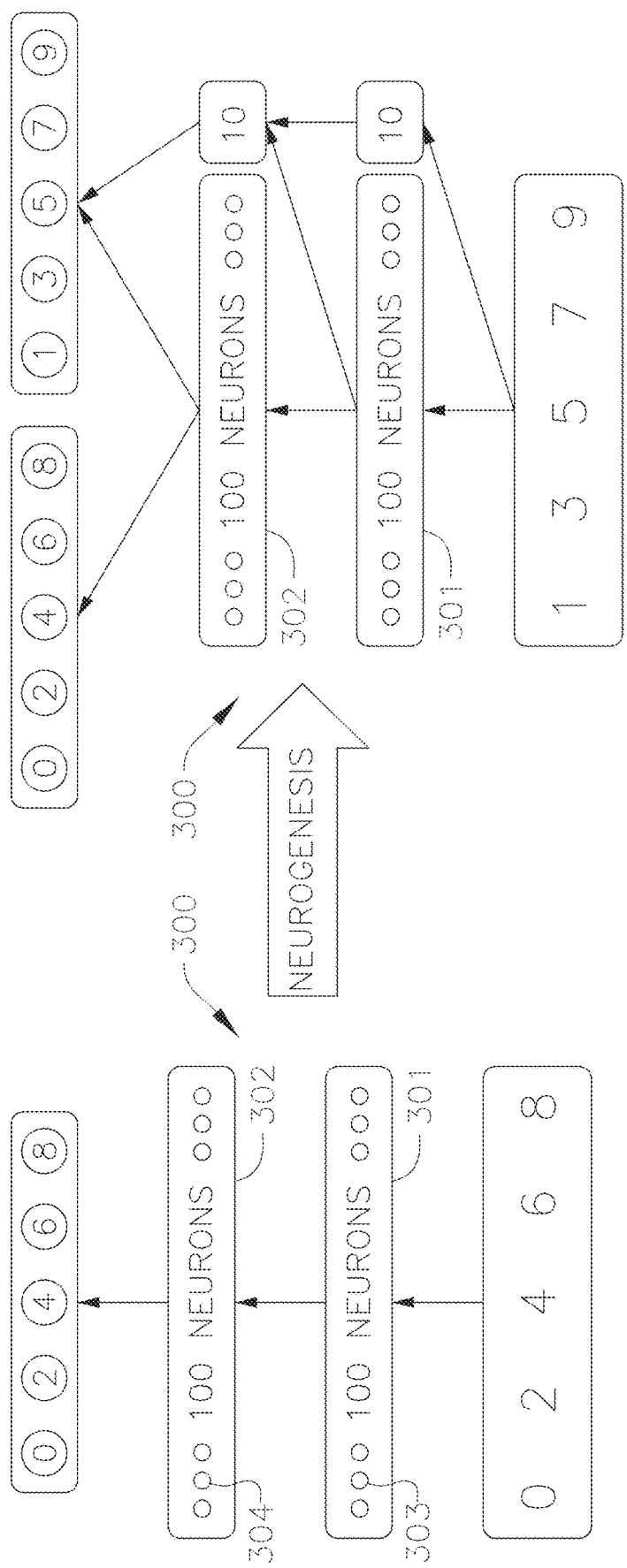
FIG. 4 is a schematic view of an artificial neural network, which was trained according to the method of FIG. 1, being tested on the Modified National Institute of Standards and Technology (MNIST) handwritten digit dataset.

FIG. 4 is a schematic view of an artificial neural network 300, before and after being trained according to the method of FIG. 1, being tested on the MNIST handwritten digit dataset, which is a benchmark problem for optical character classification. The even digits (0, 2, 4, 6, 8) served as the "old task" and the odd digits (1, 3, 5, 7, 9) served as the "new task." The artificial neural network 300 on the left of FIG. 4 depicts the artificial neural network 300 after it has been trained to perform the old task (i.e., classifying odd handwritten digits 1, 3, 5, 7, and 9), but before it has been trained in accordance with the method of FIG. 1 to perform the new task (i.e., classifying even handwritten digits 2, 4, 6, 8). The input data included 784-dimensional binary vectors, where each vector represents the back-and-white pixel values of a handwritten digit. The artificial neural network 300 in the illustrated embodiment, before it has been trained in accordance with the method of FIG. 1, includes two fully connected hidden layers 301, 302 each with one-hundred (100) nodes 303, 304, respectively, and their respective activation functions. In the illustrated embodiment, a softmax layer at the output with a cross-entropy loss was utilized. Additionally, in the illustrated embodiment, artificial neural network 300, after being trained on the old task but before being trained on the new task, achieved 98.6% classification accuracy on a held-out testing set of handwritten digits. After the artificial neural network was trained and tested on the old task, 5% of the old task training data was retained for retraining the artificial neural network on the new task.

The artificial neural network 300 on the right side of FIG. 4 depicts the artificial neural network 300 after it has been trained in accordance with the method illustrated in FIG. 1. In the illustrated embodiment, a new output layer has been added to the artificial neural network 300 because the new task requires identifying different classes than the old task (i.e., even digits identified in the old task and the odd digits identified in the new task are in different classes). Drifts D1 and D2 in the activations in the hidden layers 301, 302, respectively, were calculated utilizing SWD as training on the new task progressed. Based on the calculation of the drifts D1 and D2, ten (10) new nodes were added to each of the hidden layers 301, 302 and the new nodes were connected according to the scheme described above, as illustrated in the artificial neural network 300 on the right side of FIG. 4.

The weights of the connections between the nodes were then reset to their values before the training on the new task began. Once the weights had been reset, training on the new task (i.e., classifying odd handwritten digits) proceeded by minimizing the loss defined by Equation 2 above. In the illustrated embodiment, the user-specified coefficient $\lambda$ in Equation 2, which sets the amount of drift permitted in the activation distribution in the hidden layers and thereby controls the trade-off between maintaining performance on old tasks versus having smaller networks that perform well on the new task, was set to 1. Following training of the weights on the old and new connections, the artificial neural network 300 achieved 98.1% accuracy on the old task (i.e., classifying even-numbered handwritten digits) and 98.5% accuracy on the new task (i.e., classifying odd-numbered handwritten digits).

Figure 5:
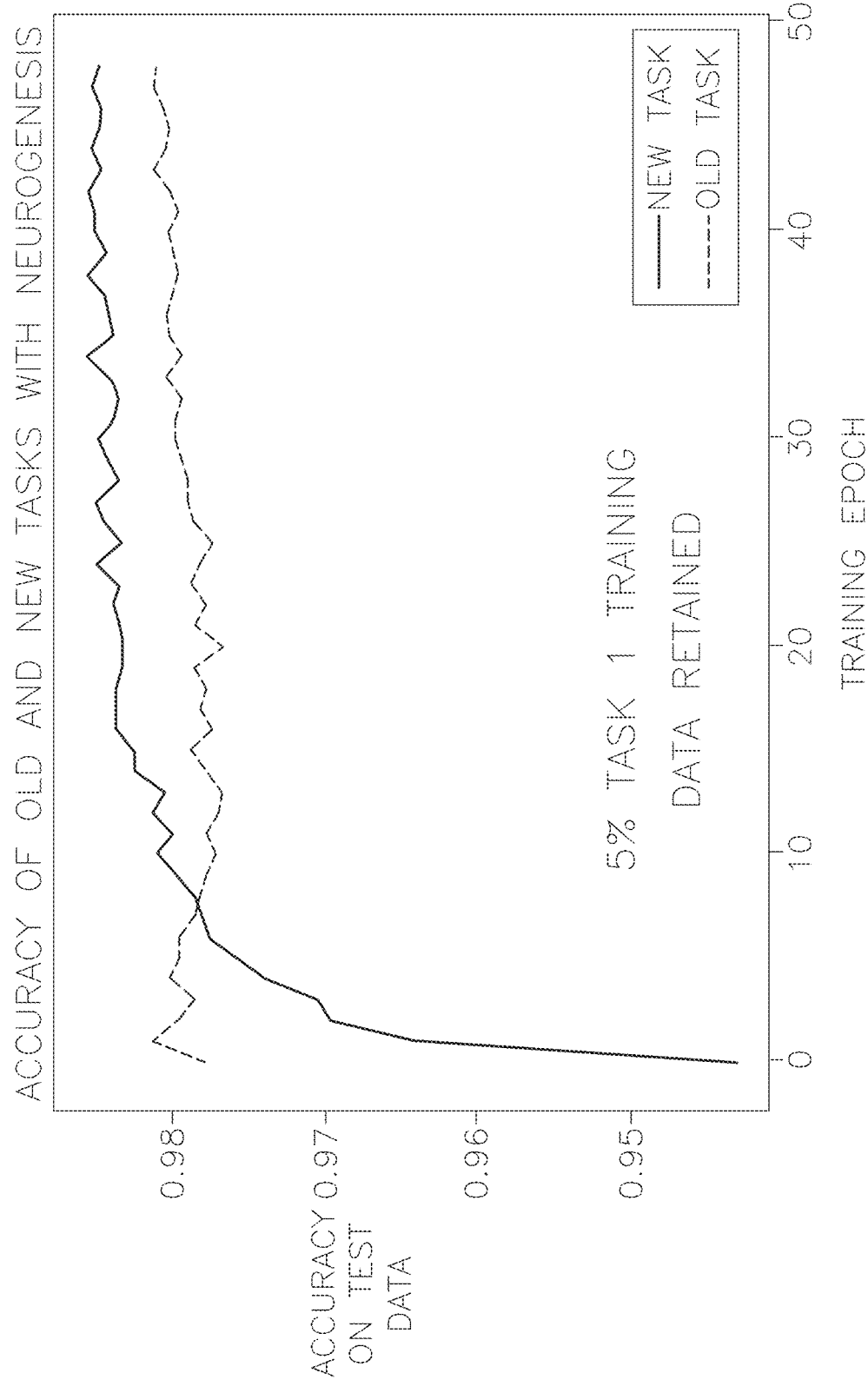
FIG. 5 is a graph illustrating training progression of the artificial neural network after the new nodes have been to the artificial neural network.

FIG. 5 is a graph illustrating training progression of the artificial neural network 300 after the new nodes have been to the artificial neural network 300. As illustrated in FIG. 5, almost no performance was lost on the old task and an equally high level of effectiveness was achieved on the new task. Furthermore, the overall size of the artificial neural network 300 needed to be increased by only 10% (i.e., 10 new nodes were added to each of the hidden layers that originally included 100 nodes). In comparison, when the artificial neural network 300 was trained on both the old and new tasks simultaneously, the artificial neural network 300 achieved 98.0% accuracy. Accordingly, the systems and methods of the present disclosure are capable of learning tasks continually with accuracies just as good as learning tasks simultaneously, which is generally easier.

The artificial neural networks of the present disclosure, and the methods of retraining the artificial neural networks according to various embodiments of the present disclosure, were also tested with a variant of the MNIST optical character recognition problem. First, a neural network was trained to classify gray-scale images of handwritten digits from 0 to 9 (old task). The images were flattened into a 748-dimensional vector. The network consisted of 3 hidden layers with hyperbolic tangent activation functions. There were 50, 30, and 20 neurons in the first, second, and third hidden layers, respectively. A new task was created by randomly generating a permutation mask and applying it to each of the digits in the dataset. The permutation mask was created by randomly selecting two non-intersecting sets of pixel indices, and then swapping the corresponding pixels in each image. In one set of experiments, 50% of the pixels in each image were modified. The resulting new task was similar enough to the old task that some information from the old network was still valid, but different enough that adding new neurons significantly improved performance on the new task. The maximum number of new neurons that could be added to any layer was set at 50, which leads to a total of $50^3=125,000$ unique individuals, where an "individual" is a parent network (trained on the old task) with new neurons added to it. The parameter $\lambda$ in Equation 2 above was set to 10.0. It was determined that smaller values of λ resulted in the complexity term dominating the fitness, which resulted in a fairly simple fitness landscape with the global optimum being achieved by adding only 1 to 3 neurons at any layer. Setting λ=10.0 provided a better balance between accuracy and complexity, and consequently, a more challenging optimization problem with many good, but suboptimal, local minima. In this setting, the global optimum is achieved by adding 17 new neurons to the first hidden layer and no new neurons to the second and third hidden layers. However, good, but suboptimal, local minima can be achieved by adding new neurons to only the second or third hidden layers.

A genetic algorithm (GA) was utilized as basis for comparison with embodiments of the present disclosure. Genetic algorithms are a good fit to this problem due to the discrete nature of the search space. For the GA, an individual was encoded as a vector of length three, where the values of the components indicated the number of new neurons to add in each of the three hidden layers. The maximum number of new neurons that could be added to any layer was 50. A population size of 30 and tournament selection with a tournament size of 3 was utilized. Among the selected population, an individual was chosen for crossover with another randomly chosen individual with probability 0.5 and was chosen for mutation with probability 0.2. Once selected for mutation, each entry in the individual was mutated uniformly at random with probability 0.3 to a value in the interval [0, 50]. The relatively high mutation rate was found to prevent pre-mature convergence to poor solutions. Two-point crossover with the crossover points being selected uniformly at random was utilized.

Figure 6:
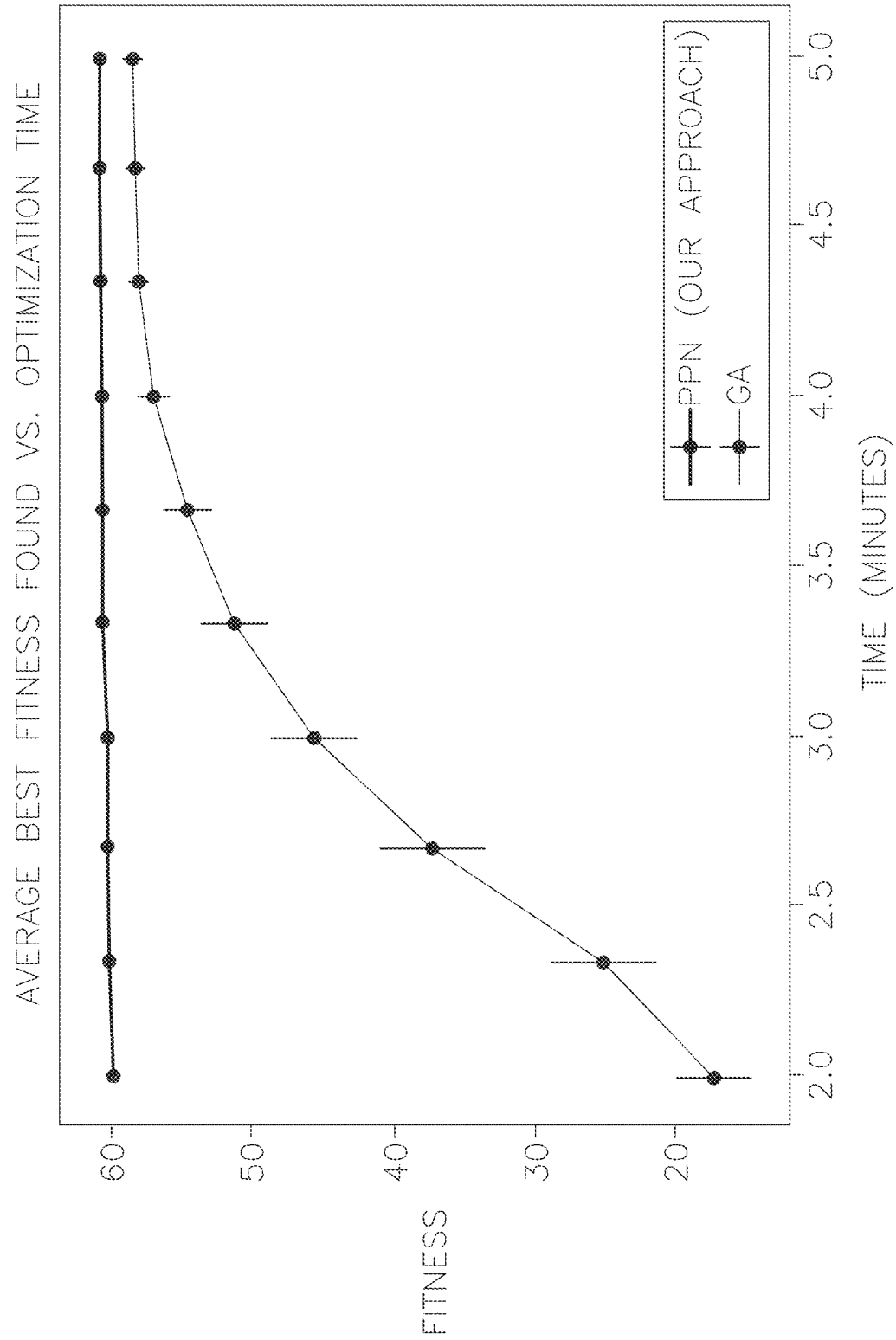
FIGS. 6-8 are graphs comparing the performance of artificial neural networks of the present disclosure (PPN) to the performance of a genetic algorithm (GA)
Figure 7:
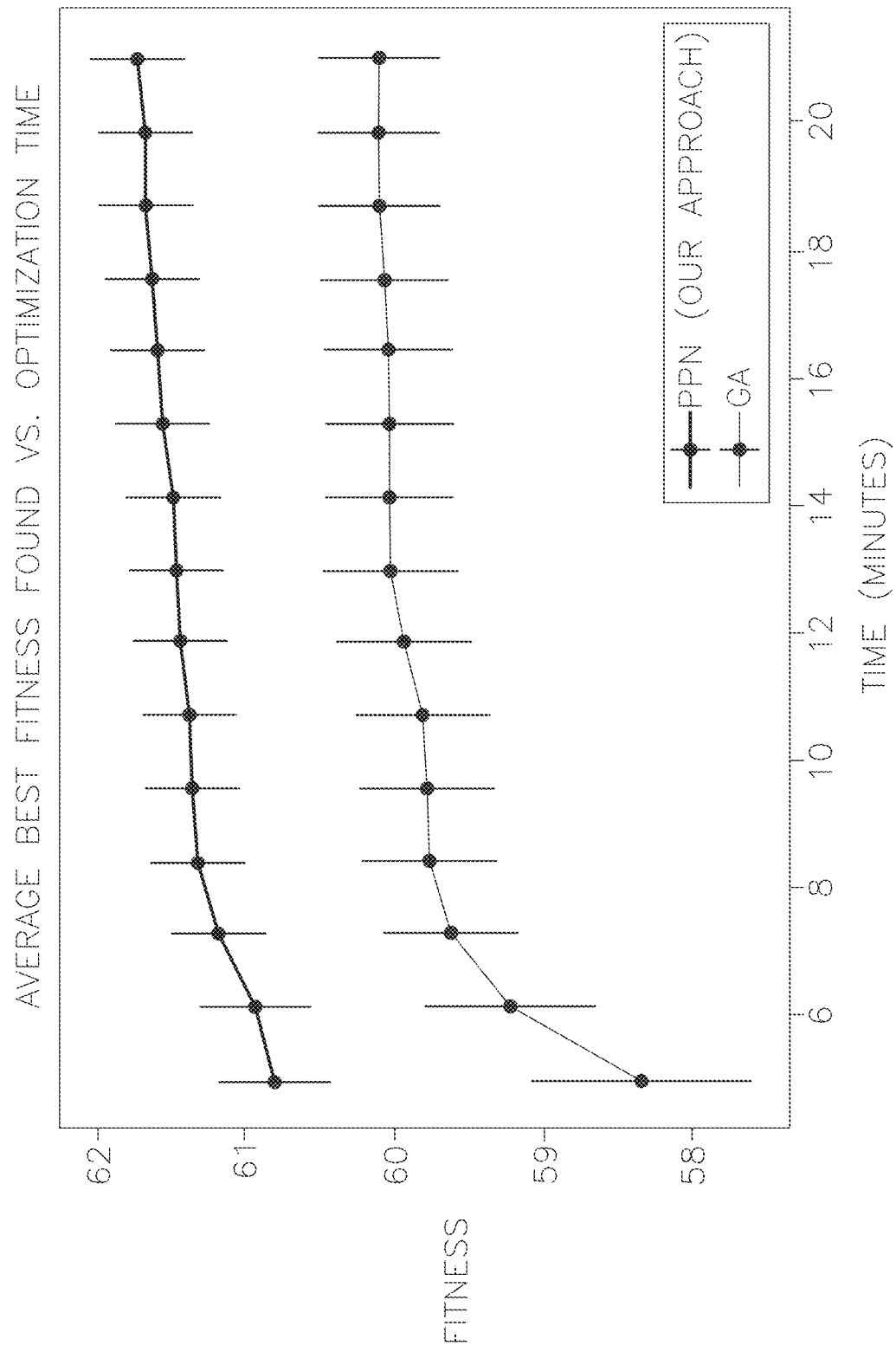

The performance according to embodiments of the present disclosure (referred to hereinafter as PPN), was compared to the performance of the GA. In this embodiment, the PPN decided where and how many new neurons to add to the artificial neural network without utilization of Equation 1 above. A total of 159 trials for the two approaches combined were performed. Each trial started with a newly initialized population, and parameters in the case of the probabilistic program learner (PPL), and then the optimization process was run for 21 minutes of wall-clock time. The results of the first analysis are shown in FIGS. 6 and 7. In each of FIGS. 6 and 7, the error bars are 90% confidence intervals. Each figure shows the average best fitness achieved by the PPN (blue) and GA (red) as a function of elapsed run time in minutes. FIG. 6 is from 2 to 5 minutes and the FIG. 7 is from 5 to 21 minutes. The fitness values used for plotting have been shifted by −8.0 and scaled by 10.0. This was done solely for the purpose of improving visual interpretability of the results. Based on the curves in FIG. 6, it can be seen that on average PPN reaches near optimal solutions (a fitness of about 60.0) within the first 2 minutes of simulation time, whereas it takes the GA about 5 minutes to reach a comparable level of fitness. FIG. 7 shows that in the long run that the PPN continues to improve and outperform the GA.

Figure 8:
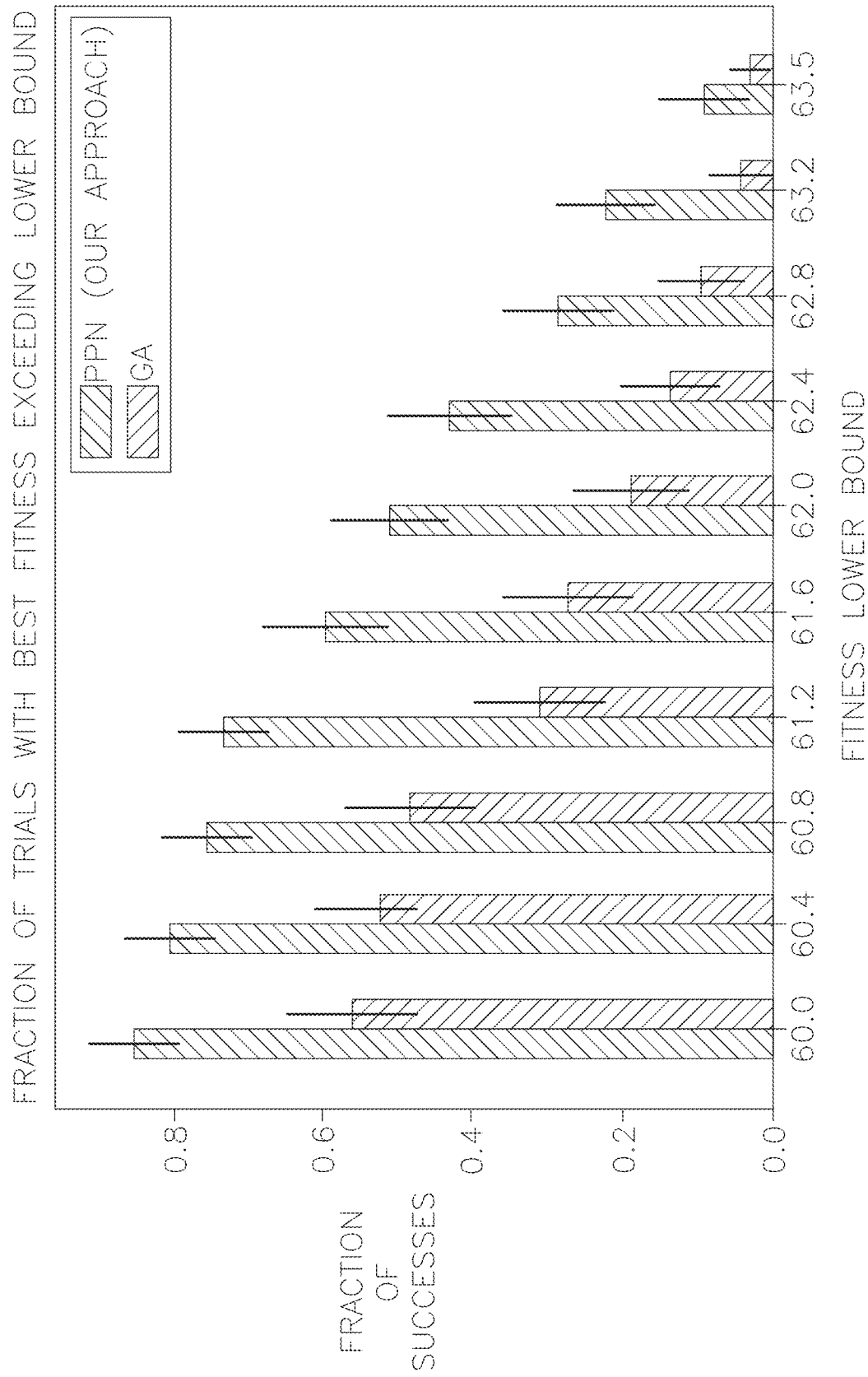

The next analysis examined the consistency with which the PPN and GA were able to find solutions that achieved particular fitness levels. FIG. 8 shows the fraction of trial runs on which the best fitness found exceeded various lower bounds. The results for the PPN are in blue and those of the GA are in red. In FIG. 8, the error bars are 90% confidence intervals. As shown in FIG. 8, for each fitness lower bound on the x-axis, the PPN exceeds the success frequency of the GA, and for the higher, more difficult to achieve fitness levels (>61) the success rate of the PPN is at least double that of the GA. These results demonstrate that the PPN finds better solutions than the GA.

Figure 9:
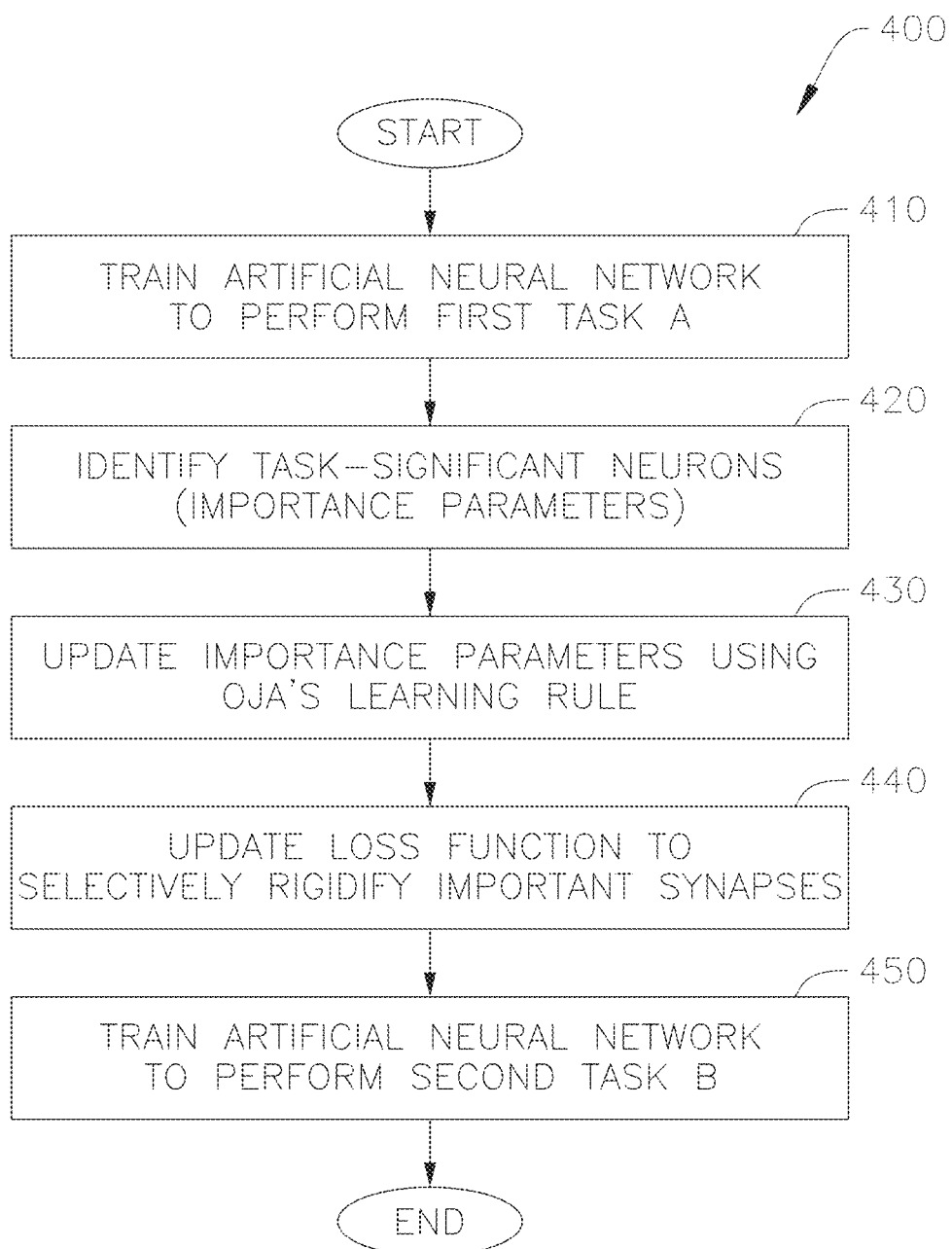
FIG. 9 is a flowchart illustrating tasks of a method of training an artificial neural network according to one embodiment of the present disclosure.
Figure 10:
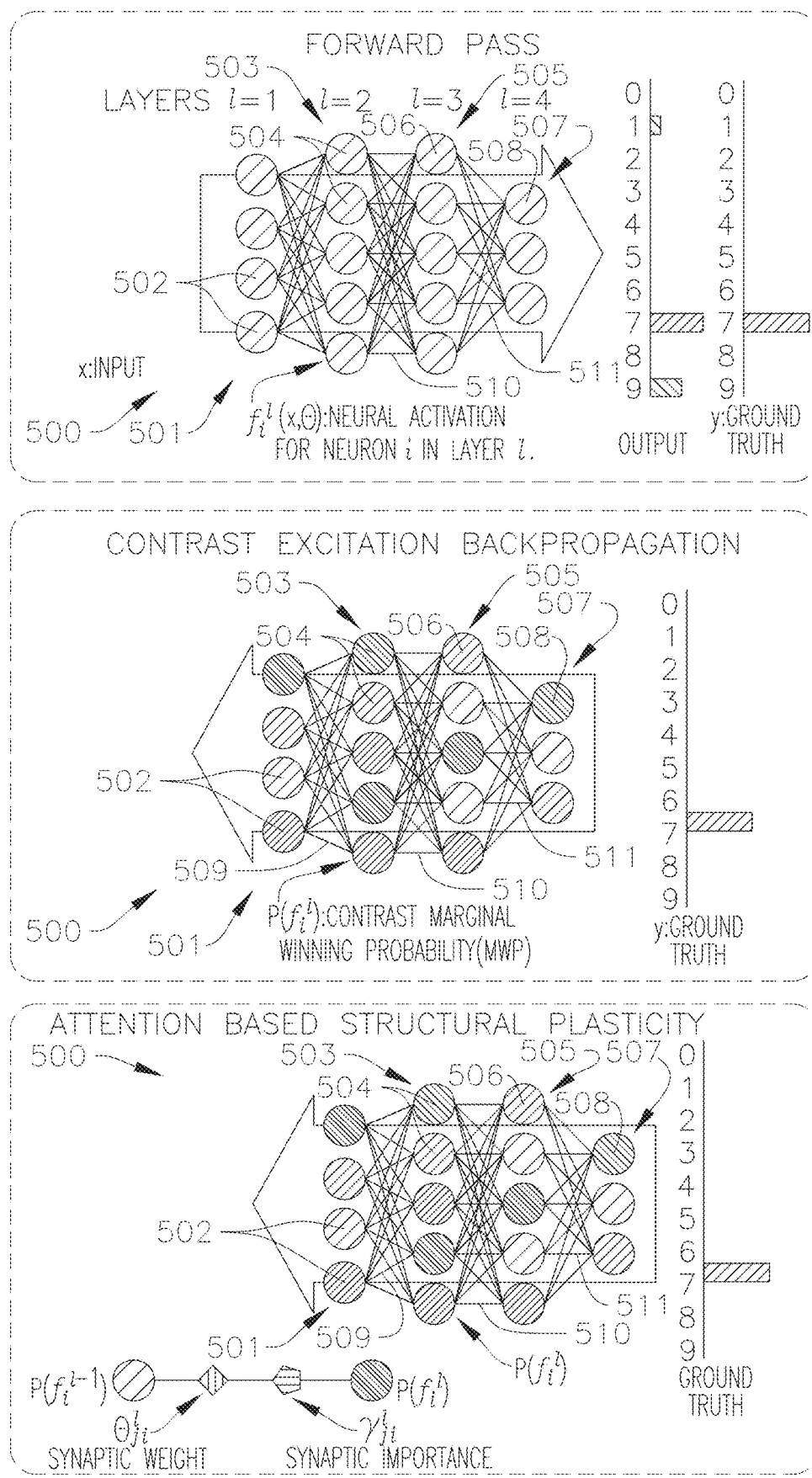
FIG. 10 is schematic view of an artificial neural network being trained according to the method of FIG. 1.

FIG. 9 is a flowchart illustrating tasks of a method 400 of training an artificial neural network utilizing selective synaptic plasticity according to one embodiment of the present disclosure. FIG. 10 depicts an example of an artificial neural network 500 undergoing training according to the method 400 illustrated in FIG. 9. In the embodiment illustrated in FIG. 10, the artificial neural network 500 includes an input layer 501 having a series of input layer neurons 502, a first hidden layer 503 having a series of first hidden layer neurons 504, a second hidden layer 505 having a series of second hidden layer neurons 506, and an output layer 507 having a series of output layer neurons 508. In the illustrated embodiment, a series of synapses 509 connect each of the input layer neurons 502 in the input layer 501 to each of the first hidden layer neurons 504 in the first hidden layer 503, a series of synapses 510 connect each of the first hidden layer neurons 504 in the first hidden layer 503 to each of the second hidden layer neurons 506 in the second hidden layer 505, and a series of synapses 511 connect each of the second hidden layer neurons 506 in the second hidden layer 505 to each of the output layer neurons 508 in the output layer 507. Moreover, each of the synapses 509, 510, 511 between the neurons in adjacent layers have an associated connection weight. Additionally, each of the neurons 502, 504, 506, 508 in the artificial neural network 500 is associated with an activation function configured to receive the inputs to the neurons 502, 504, 506, 508 as arguments to the activation function and compute an output value for the neurons 502, 504, 506, 508 based on the inputs to determine the activation states of the neurons 502, 504, 506, 508. Although in the illustrated embodiment the artificial neural network 500 includes two hidden layers 503, 505, in one or more embodiments, the artificial neural network 500 may include any other suitable number of hidden layers and each layer may have any suitable number of neurons depending, for instance, on the desired complexity of the task that the artificial neural network is capable of learning and performing during artificial neural network inference. Furthermore, although in the illustrated embodiment the artificial neural network 500 is a fully-connected artificial neural network (i.e., each neuron is connected to each neuron in the adjacent layer), in one or more embodiments, the artificial neural network 500 may not be fully connected.

In the embodiment illustrated in FIG. 9, the method 400 includes a task 410 of training the artificial neural network 500 to perform a first task A (e.g., semantic segmentation of an image of a driving scene, such as nighttime image, a daytime image, or a rainy image). The task 410 of training the artificial neural network 500 includes updating the artificial neural network 500 via backpropagation to update the synaptic weights to minimize the loss according to a suitable loss function.

In the illustrated embodiment, the method 400 also includes a task 420 of calculating or determining the neurons 502, 504, 506, 508 of the artificial neural network 500 that are significant for the performance of the first task A (i.e., the task 420 includes identifying task-significant neurons 502, 504, 506, 508 in the artificial neural network 500). In one or more embodiments, the task 420 of identifying the task-significant neurons 502, 504, 506, 508 includes performing excitation backpropagation (EBP) to obtain top-down signals that identify the task-significant neurons 502, 504, 506, 508 of the artificial neural network 500. EBP provides a top-down attention model for neural networks that enables generation of task/class-specific attention maps. EBP introduces a back-propagation scheme by extending the idea of winner-take-it-all into a probabilistic setting. In one or more embodiments, the task 420 of calculating the neurons 502, 504, 506, 508 of the artificial neural network 500 that are significant for the performance of the first task may utilize the c-EBP algorithm to make the top-down signal more task-specific. In the EBP formulation, the top-down signal is defined as a function of the probability output.

In one or more embodiments, the task 420 of identifying the task-significant neurons 502, 504, 506, 508 for the performance of the first task A may be performed by defining the relative importance of neuron $f_j^{(l-1)}$ on the activation of neuron $f_i^l$ as a probability distribution $P(f_j^{(l-1)})$, over neurons in layer (l–1), where $f_i^l$ is the i'th neuron in layer l of the artificial neural network 500, where $P(f_j^{(l-1)}) = \sigma(\Sigma_{ji}\theta_{ji}^l f_j^{(l-1)})$, and where $\theta^l$ is the synaptic weights between layers (l–1) and l. The probability distribution $P(f_j^{(l-1)})$ can be factored as follows:

$$P(f_j^{(l-1)}) = \Sigma_i P(f_j^{(l-1)} | f_i^l) P(f_i^l) \quad \text{(Equation 1)}$$

$P(f_j^l)$ is the Marginal Winning Probability (MWP) for neuron $f_i^l$. Additionally, in one or more embodiments, the task 420 includes defining the conditional probability $P(f_j^{(l-1)} | f_i^l)$, as follows:

$$P(f_j^{(l-1)} | f_i^l) = \begin{cases} Z_i^{(l-1)} f_j^{(l-1)} \theta_{ji}^l & \text{if } \theta_{ji}^{(l-1)} \geq 0, \\ 0 & \text{otherwise} \end{cases} \quad \text{(Equation 2)}$$

where $Z_i^{(l-1)} = (\Sigma_j f_j^{(l-1)} \theta_{ji}^l)^{-1}$ is a normalization factor such that $\Sigma_i P(f_j^{(l-1)} | f_i^l) = 1$. For a given input, x (e.g., an input image), EBP generates a heat-map in the pixel-space with respect to class y by starting with $P(f_i^L = y) = 1$ at the output layer 507 and applying Equation 2 above recursively. The contrastive excitation backpropagation (c-EBP) assigns a hypothetical negative neuron $\bar{f}_i^L$ with weights $\bar{\gamma}_{ji}^L = \gamma_{ji}^L$. Additionally, the c-EBP then recursively calculates $\bar{P}(f_j^{(l-1)} | f_i^l)$ for this negative neuron $\bar{f}_i^L$. The final relative importance of the neurons is then calculated as a normalized difference of $P(f_j^{(l-1)})$ and $\bar{P}(f_j^{(l-1)} | f_i^l)$ as follows:

$$P_c(f_j^{(l-1)} | f_i^l) = \frac{ReLU(P(f_j^{(l-1)} | f_i^l) - \bar{P}(f_j^{(l-1)} | f_i^l))}{\sum_j ReLU(P(f_j^{(l-1)} | f_i^l) - \bar{P}(f_j^{(l-1)} | f_i^l))}$$

where ReLU is the rectified linear function. Additionally, the contrastive-MWP, $P_c(f_i^l)$, indicates the relative importance of neuron $f_i^l$ for specific prediction y. Additionally, the contrastive-MWP, $P_c(f_i^l)$, can be understood as the implicit amount of attention that the artificial neural network 500 pays to neuron $f_i^l$ to predict y.

Figure 11:
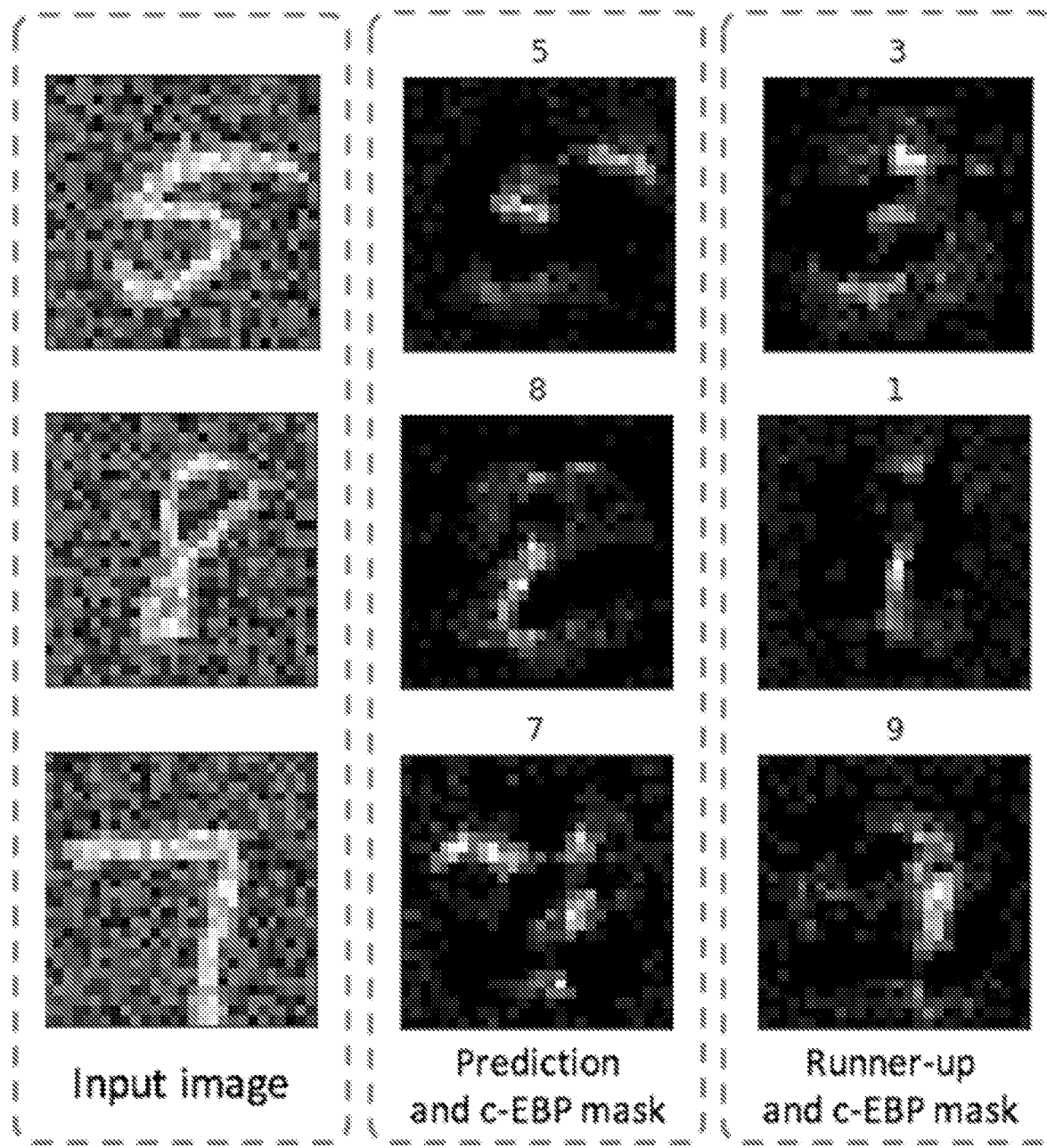
FIG. 11 is a depiction of contrastive excitation backpropagation (c-EBP) top-down attention maps of the artificial neural network of the present disclosure when trained on a MNIST dataset.

FIG. 11 is a depiction of c-EBP top-down attention maps at the input layer 501 of the artificial neural network 500 of the present disclosure when trained on a Modified National Institute of Standards and Technology (MNIST) handwritten digit dataset, which is a benchmark problem for optical character classification. The left column of images in FIG. 11 are the input images (e.g., images of handwritten numbers "5,", "8", and "7"), the middle column of images in FIG. 11 are the attentional map generated by c-EBP during task 420 for the predicted labels (i.e., the highest activity after the softmax layer), and the right column of images in FIG. 11 are the runner-up predicted labels. As illustrated in FIG. 11, the top-down signals contain the task-relevant portions of the input (i.e., the input neurons 502). Task 420 calculates these top-down importance signals utilizing c-EBP for all neurons 502, 504, 506, 508 in the artificial neural network 500.

With continued reference to FIG. 9, the method 400 also includes a task 430 of determining the importance of the synapses 509, 510, 511 between the neurons 502, 504, 506, 508 for the performance of the first task A for which the artificial neural network 500 is trained in task 410 (i.e., the task 430 includes identifying attention-based synaptic importance for the performance of the first task A). In one or more embodiments, the importance of a synapse 509, 510, 511 is increased if its pre- and post-synaptic neurons 502, 504, 506, 508 are important, as identified according to Equation 1 above in task 420 (i.e., if a synapse 509, 510, 511 is between two task-relevant neurons 502, 504, 506, 508, then its importance is increased). In one or more embodiments, the task 430 of identifying the importance of the synapses 509, 510, 511 is performed utilizing a Hebbian learning algorithm. In one or more embodiments, the task 430 of identifying the importance of the synapses 509, 510, 511 utilizing the Hebbian learning algorithm includes calculating a synaptic importance parameter $\beta_{ji}^l$ for each of the synapses 509, 510, 511. According to one or more embodiments of the present disclosure, the synaptic importance parameter $\beta_{ji}^l$ for each of the synapses 509, 510, 511 is initialized to zero, and, during the training of the artificial neural network 500 to perform the first task during task 410, for each input image $x_n$, the importance parameters $\beta_{ji}^l$ of the artificial neural network 500 are updated according to Equation 3 as follows:

$$\beta_{ji}^l = \beta_{ji}^l + P(a_j^l(x_n))P(a_i^{l+1}(x_n)) \quad \text{(Equation 3)}$$

where $a_j^l$ is the j'th neuron in the l'th layer of the artificial neural network, $a_i^{l+1}$ is the i'th neuron in the l+1 layer of the artificial neural network, and P is a probability.

Additionally, in one or more embodiments, the probability distribution for the output layer 507 is set to the one-hot vector of the input label, $P(a_j^L(x_n)) = y_n$.

However, Hebbian learning of importance parameters may suffer from the problem of unbounded growth of the importance parameters. To avoid the problems of Hebbian learning, in one or more embodiments the task 430 of determining the synaptic importance utilizes Oja's learning rule (i.e., Oja's learning algorithm) to calculate the importance, $\gamma_{ji}^l$, of the synapse between the neurons $f_j^{(l-1)}$ and $f_i^l$ for the first task A as follows:

$$\gamma_{ji}^l = \gamma_{ji}^l \in (P_c(f_j^{(l-1)}) P_c(f_j^l) - P_c(f_i^l)^2 \gamma_{ji}^l) \quad \text{(Equation 4)}$$

where $\in$ is the rate of Oja's learning rule, i and j are neurons, l is a layer of the artificial neural network, and $P_c$ is a probability. The task 430 of updating the importance parameters via Oja's learning rule is performed in an online manner, starting from $\gamma_{ji}^l = 0$, during or following the task of updating the artificial neural network 500 via back-propagation during the task 410 of training the artificial neural network 500.

With continued reference to the embodiment illustrated in FIG. 9, the method 400 also includes a task 440 of rigidifying the important synapses identified in task 430 such that weights associated with those important synapses are fixed or substantially fixed (i.e., remain constant or substantially constant) when the artificial neural network 500 is trained on one or more new tasks (i.e., when the artificial neural network 500 is trained to perform inference on one or more tasks that are different than the task that the artificial neural network 500 was originally trained to perform). In one or more embodiments, the weights associated with the important synapses may not be fixed, but the important synapses may be allocated relatively less plasticity than the synapses that are not important for the performance of the first task A. In this manner, the artificial neural network 500, following the task 440 of rigidifying the synapses associated with the important neurons, exhibits selective plasticity without catastrophic forgetting. In one or more embodiments, the task 440 of rigidifying the important synapses is performed by regularizing the loss function of the artificial neural network 500 with the computed synaptic importance parameters (calculated according to task 430 described above) as follows:

$$\mathcal{L}(\theta) = \mathcal{L}_B(\theta) + \lambda \Sigma_k \gamma_k (\theta_k - \theta_{A,k}^*)^2 \qquad \text{(Equation 5)}$$

where $\mathcal{L}(\theta)$ is the loss function, $\mathcal{L}_B(\theta)$ is the original loss function for learning a second task (task B) different than the first task A (i.e., the cross entropy loss), $\lambda$ is the regularization coefficient, $\gamma_k$ is the synaptic importance parameter defined in Equation 4 above (where k is the sum over i, j, and l), and $\theta_k$ is the synaptic weights, and $\theta_{A,k}^*$ are the optimized synaptic weights for performing task A. In one or more embodiments, the importance parameters may be calculated in an online manner such that there is no need for definition of tasks and the method can adaptively learn the changes in the training data.

In the illustrated embodiment, the method 400 also includes a task 450 of training the artificial neural network 500 on the second task B different than the first task A on which the artificial neural network 500 was trained in task 410. As described above, the artificial neural network 500, following the task 440 of rigidifying the synapses associated with the important neurons, exhibits selective plasticity without catastrophic forgetting when the artificial neural network 500 is trained on the second task B different from the first task A.

Figure 12:
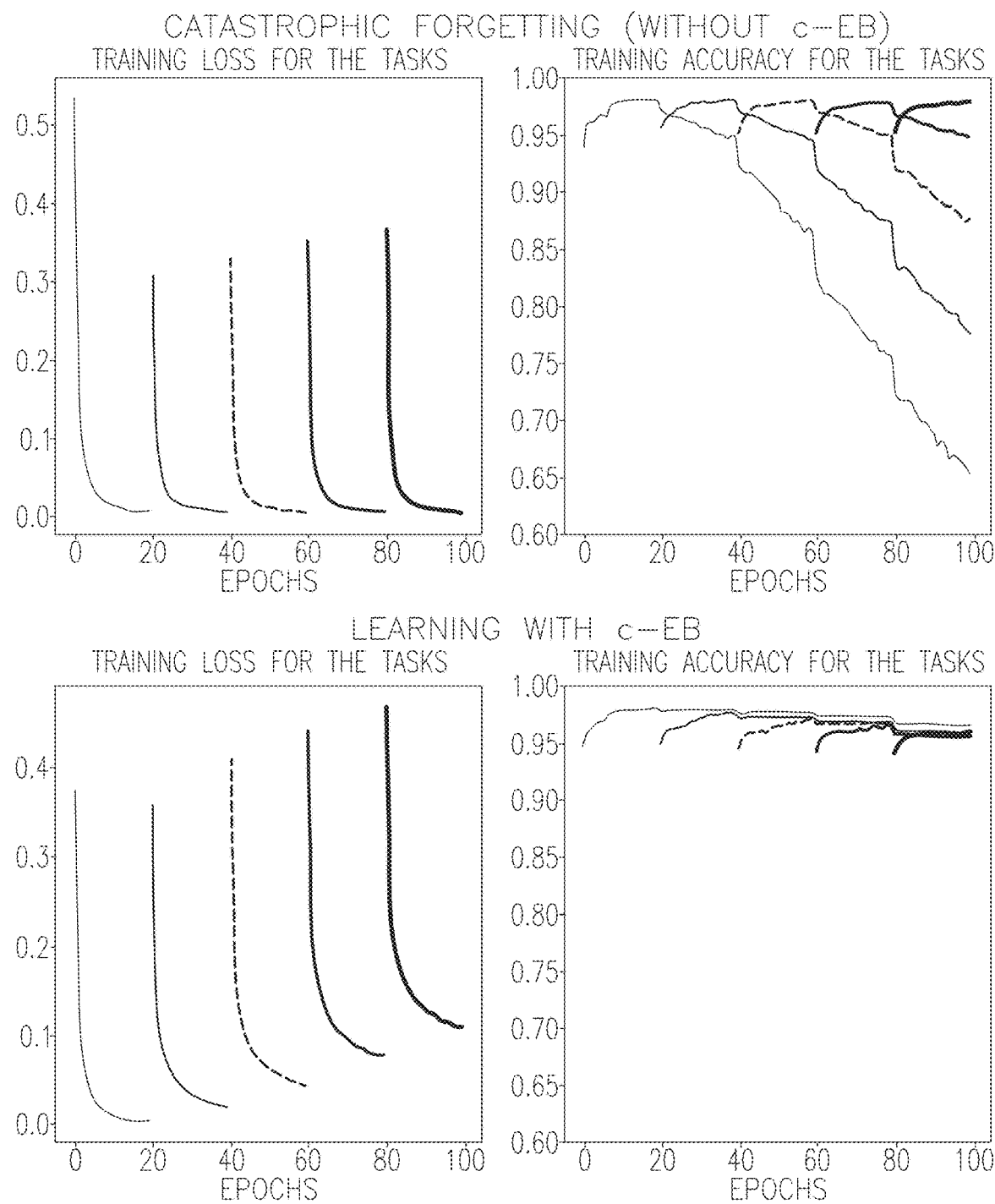
FIG. 12 depicts graphs comparing the performance of the systems and methods of the present disclosure utilizing c-EBP to related art systems and methods not utilizing c-EBP at performing five different permuted MNIST tasks.

FIG. 12 depicts graphs comparing the performance of the systems and methods of the present disclosure utilizing c-EBP to related art systems and methods not utilizing c-EBP at performing five different permuted MNIST tasks, shown at the top row of images in FIG. 12. In the illustrated embodiment, the first task is an original MNIST problem and the second, third, fourth, and fifth tasks are fixed but random permutations of the digit images. In one or more embodiments, the artificial neural network was first trained on the first task (i.e., learning the original MNIST digit image) according to an embodiment of the method 400 disclosed herein (i.e., attention-based selectively plastic perceptron). After training on the original MNIST digit image and achieving saturated accuracy (approximately 98%), attention maps were generated utilizing c-EBP. Gaussian noise was added to the MNIST test images (tasks 2 through 5) and then the attention maps were calculated at the input layer of the artificial neural network setting the top down signal to be (1) the predicted label (i.e., the neuron with the highest activation after softmax layer) and (2) the runner up predicted label (i.e., the neuron with the second highest activation). FIG. 11 depicts the inputs and their corresponding attention maps for three sample digits. FIG. 12 depicts the results of learning the consecutive permuted MNIST problems. In the illustrated embodiment, a Multi-Layer Perceptron (MLP) with two hidden layers, each having four-hundred neurons, was utilized. Additionally, Rectified Linear Units (ReLUs) were utilized as nonlinear activation functions and the ADAM optimizer with learning rate, lr=1e−3, for optimizing the networks. FIG. 12 depicts the average training loss as well as the average testing accuracy over 10 runs for all five tasks for both the related art network (i.e., a related art network trained without selective plasticity) and an artificial neural network trained according to the methods of the present disclosure (i.e., with selective plasticity). As illustrated in FIG. 12, the related art method without selective plasticity suffered from catastrophic forgetting (e.g., the accuracy of performing the first task dropped to approximately 65%, the accuracy of performing the second task dropped to approximately 77%, and the accuracy of performing the third task dropped to approximately 87% when the artificial neural network was trained on the permuted MNIST problems consecutively), whereas the method of the present disclosure utilizing selective plasticity did not suffer from catastrophic forgetting (e.g., the accuracy of performing each of the tasks remained at approximately 95% when the artificial neural network was trained on the permuted MNIST problems consecutively).

Figure 13:
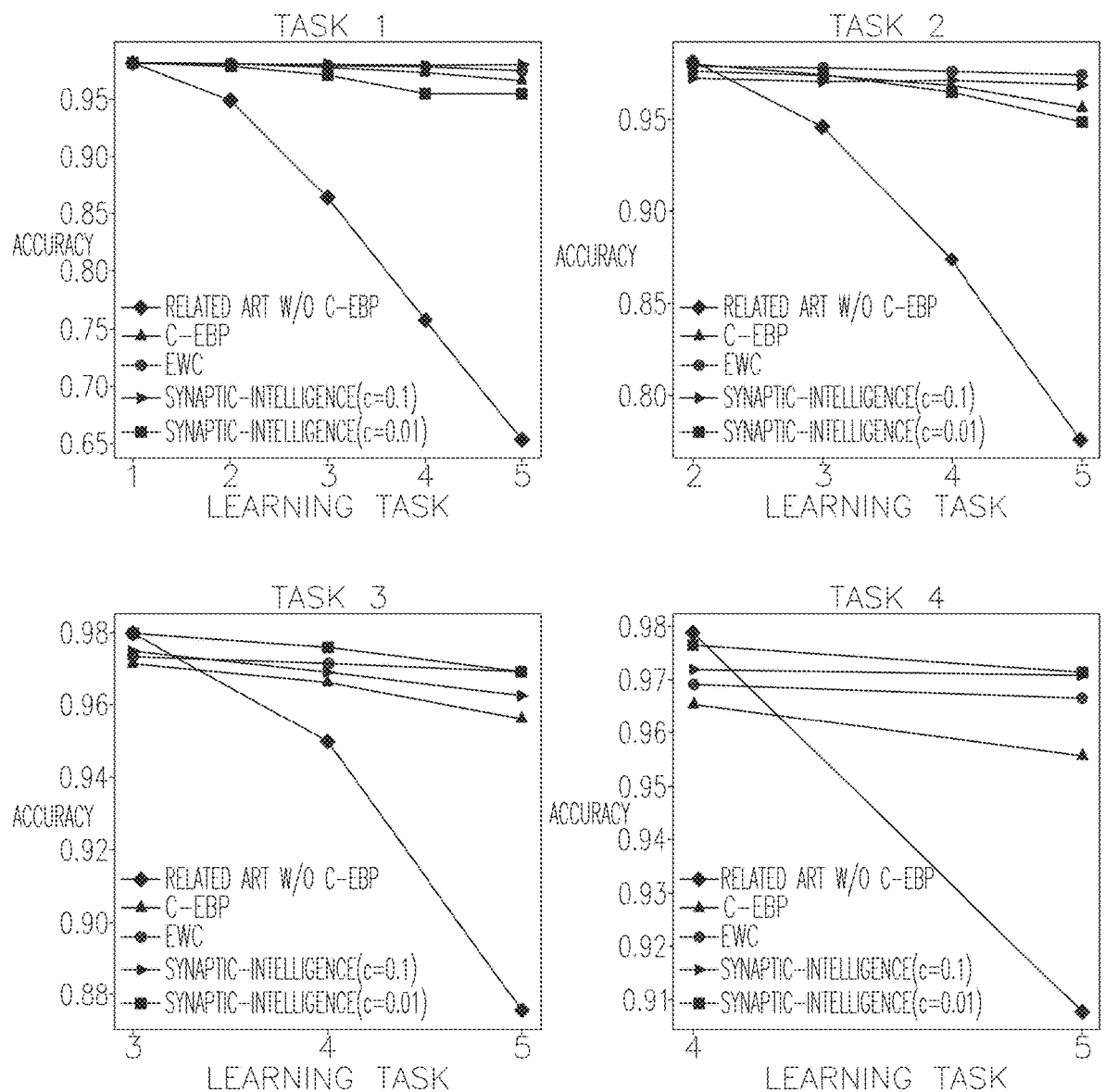
FIG. 13 depicts graphs comparing the performance of the systems and methods of the present disclosure utilizing c-EBP to related art systems and methods, Elastic Weight Consolidation (EWC) and Synaptic Intelligence, at performing the five different permuted MNIST tasks.

FIG. 13 depicts graphs comparing the performance of the systems and methods of the present disclosure utilizing c-EBP to related art systems and methods, Elastic Weight Consolidation (EWC) and Synaptic-Intelligence, at performing the five different permuted MNIST tasks. In FIG. 13, the upper left hand graph depicts the efficiency of the various methods and systems at performing the first task (i.e., recognizing the first handwritten number) while learning each of the subsequent tasks (i.e., recognizing the second, third, fourth, and fifth permuted handwritten numbers). Similarly, the upper right hand graph depicts the efficiency of the various methods and systems at performing the second task while learning each of the subsequent tasks, the lower left hand graph depicts the efficiency of the various methods and systems at performing the third task while learning each of the subsequent tasks, and the lower right hand graph depicts the efficiency of the various methods and systems at performing the fourth task while learning the final task (i.e., Task 5, the last permuted hand written number). The network architecture, optimizer, learning rates, and batch size (batch size=400) were kept the same for all methods and the optimal hyper parameters disclosed in Kirkpatrick, "Overcoming catastrophic forgetting in neural networks," Proceedings of the national academy of sciences, page 501611835, 5017 and Zenke, "Continual learning through synaptic intelligence," International Conference on Machine Learning, pages 3987-3995, 5017, were utilized. The entire contents of Kirkpatrick and Zenke are incorporated herein by reference. Each plot in FIG. 13 shows the classification accuracy for task t after learning tasks t, t+1, . . . t=5. In FIG. 13, c is a hyper-parameter for the Synaptic Intelligence algorithm, and FIG. 13 depicts the performance of the Synaptic Intelligence algorithm utilizing c=0.1 and c=0.01. As shown in FIG. 13, the artificial neural network trained according to the methods disclosed herein (i.e., with selective plasticity) performed comparably to the EWC and Synaptic Intelligence algorithms with no or substantially no hyper-parameter tuning of the network training according to the methods disclosed herein.

Figure 14:
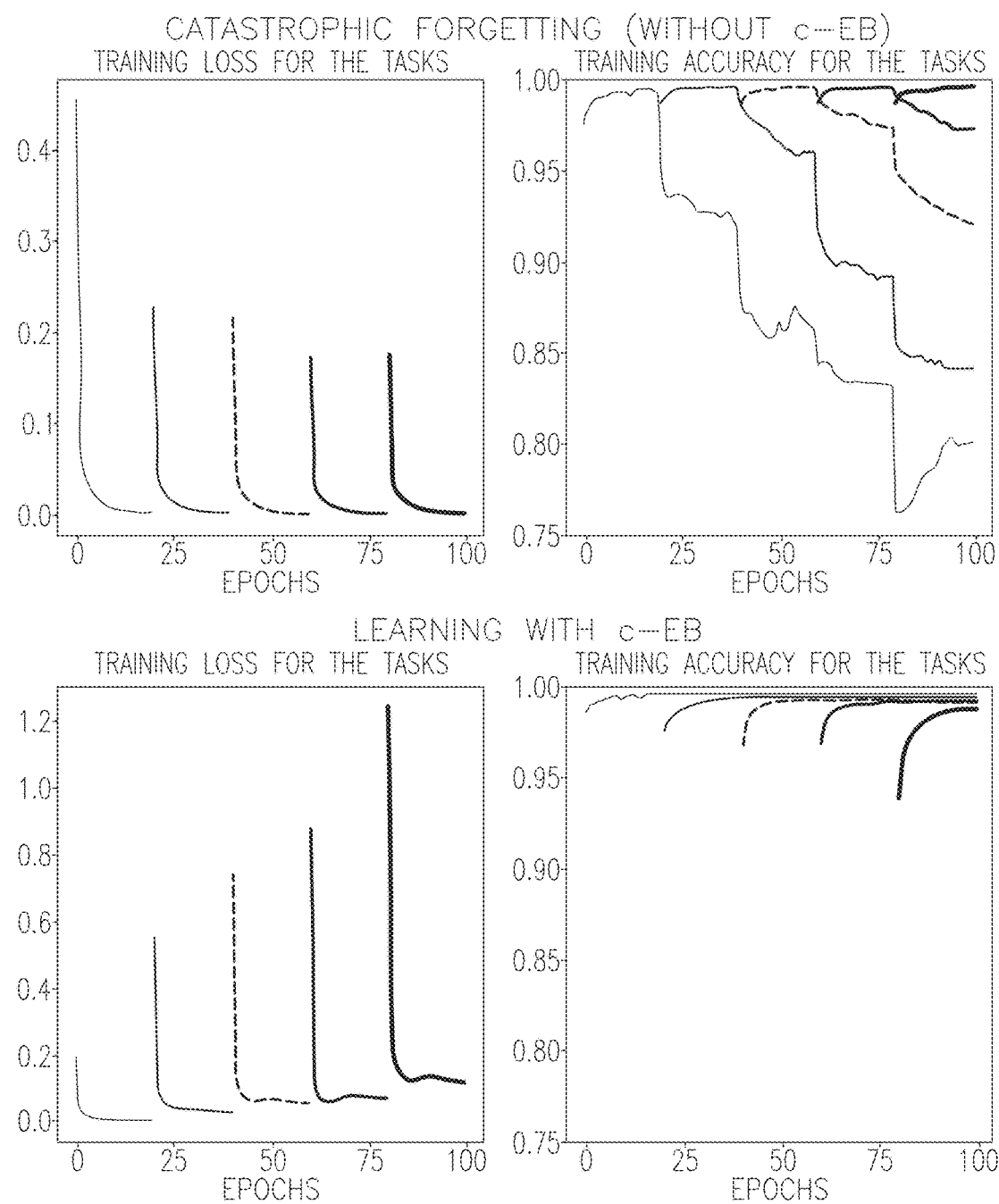
FIG. 14 depicts graphs comparing the performance of the systems and methods of the present disclosure utilizing c-EBP to related art systems and methods not utilizing c-EBP at performing five different split MNIST tasks.

FIG. 14 depicts graphs comparing the performance of the systems and methods of the present disclosure utilizing c-EBP to related art systems and methods not utilizing c-EBP at performing five different split MNIST tasks. In the illustrated embodiment, the split MNIST tasks are randomly chosen pairs of digits (e.g., [0,8], [7,3], [6,2], [1,5], and [9,4]). In general, the split MNIST task is a more realistic lifelong learning scenario compared to the permuted MNIST described above with reference to FIGS. 12-13. In split MNIST, knowledge from the previously learned tasks could be transferred to learning future tasks.

As illustrated in FIG. 14, the related art method without selective plasticity suffered from catastrophic forgetting (e.g., the accuracy of performing the first split MNIST task dropped to approximately 80%, the accuracy of performing the second split MNIST task dropped to approximately 85%, and the accuracy of performing the third split MNIST task dropped to approximately 92% when the artificial neural network was trained on the permuted MNIST problems consecutively), whereas the method of the present disclosure utilizing selective plasticity did not suffer from catastrophic forgetting (e.g., the accuracy of performing each of the split MNIST tasks remained at approximately 400% when the artificial neural network was trained on the permuted split MNIST problems consecutively).

Figure 15:
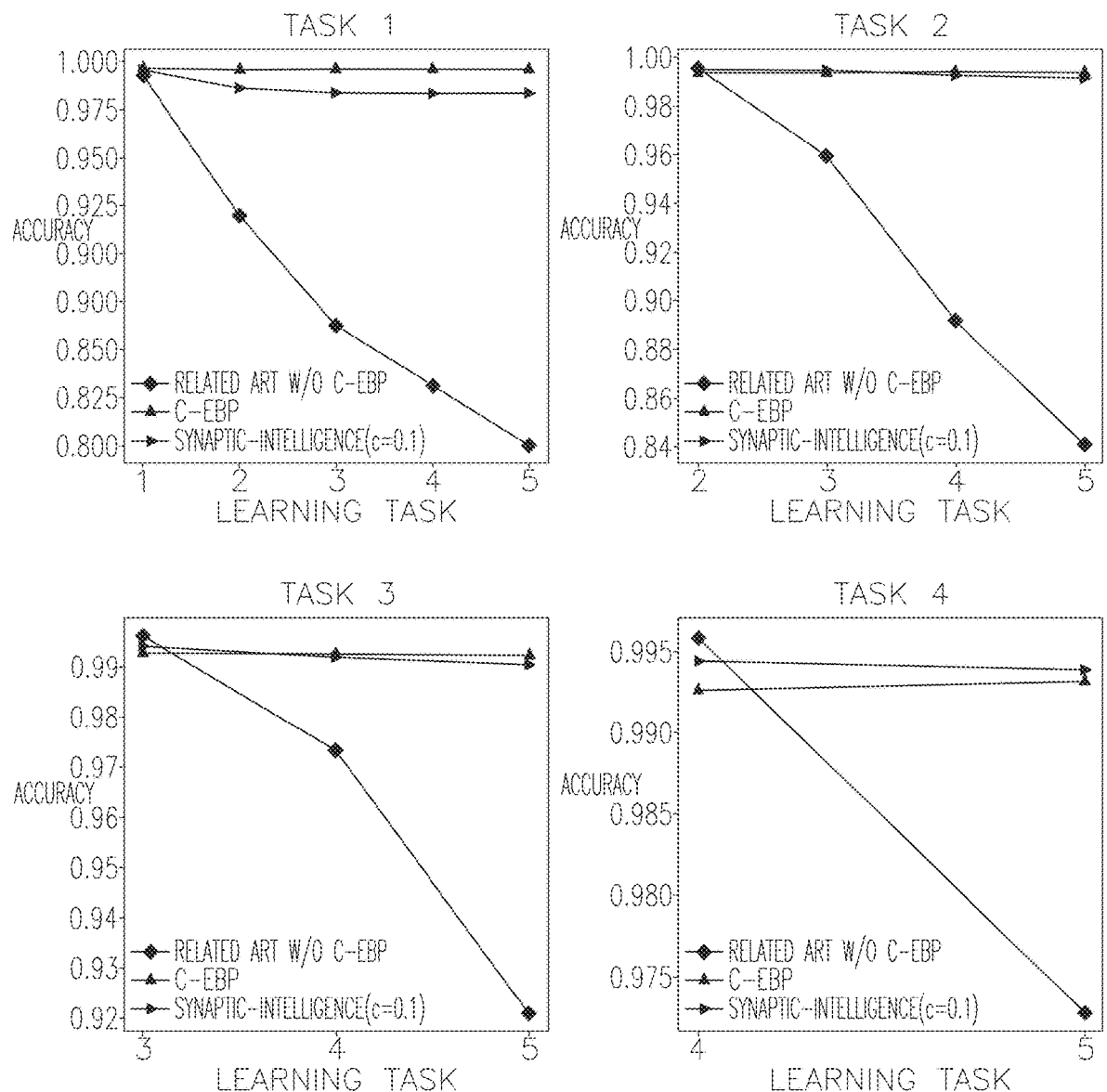
FIG. 15 depicts graphs comparing the performance of the systems and methods of the present disclosure utilizing c-EBP to related art systems and methods, Elastic Weight Consolidation (EWC) and Synaptic Intelligence, at performing the five different split MNIST tasks.

FIG. 15 depicts graphs comparing the performance of the systems and methods of the present disclosure utilizing c-EBP to a related art system and method, Synaptic Intelligence, as well as to a related art neural network with the same architecture as the present disclosure, but without utilizing c-EBP, at performing the five different split MNIST tasks. As illustrated in FIG. 15, the systems and methods of the present disclosure utilizing c-EBP performed comparably to the Synaptic Intelligence method, and both performed substantially better than the related art neural network that did not utilize c-EBP.

The methods of the present disclosure may be performed by a processor and/or a processing circuit executing instructions stored in non-volatile memory (e.g., read-only memory ("ROM"), programmable ROM ("PROM"), erasable programmable ROM ("EPROM"), electrically erasable programmable ROM "EEPROM"), flash memory, etc.). The term "processor" or "processing circuit" is used herein to include any combination of hardware, firmware, and software, employed to process data or digital signals. The hardware of a processor may include, for example, application specific integrated circuits (ASICs), general purpose or special purpose central processors (CPUs), digital signal processors (DSPs), graphics processors (GPUs), and programmable logic devices such as field programmable gate arrays (FPGAs). In a processor, as used herein, each function is performed either by hardware configured (i.e., hardwired) to perform that function, or by more general purpose hardware, such as a CPU, configured to execute instructions stored in a non-transitory storage medium. A processor may be fabricated on a single printed wiring board (PWB) or distributed over several interconnected PWBs. A processor may contain other processors; for example a processor may include two processors, an FPGA and a CPU, interconnected on a PWB.

Figure 16:
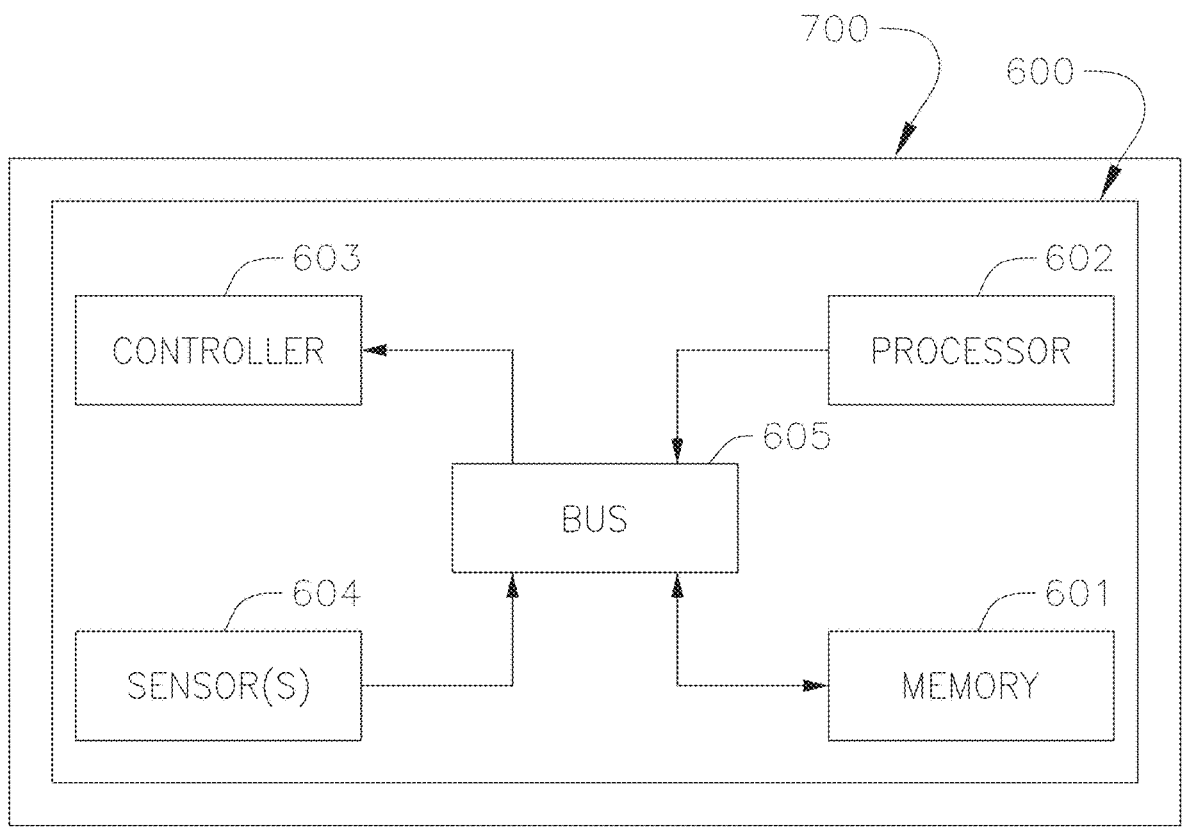
FIG. 16 is a block diagram of an autonomous system according to one embodiment of the present disclosure.

FIG. 16 is a block diagram of an autonomous system 600 incorporated into a device or system 700, such as a vehicle (e.g., an automobile, an aircraft, or a vehicle, intelligence, surveillance and reconnaissance (ISR) device), manufacturing equipment, or industrial equipment (e.g., automated assembly line equipment). The autonomous system 300 may be configured to autonomously control, at least in part, the device or system 700 into which the autonomous system 600 is incorporated. For instance, in one or more embodiments, the autonomous system 600 may be utilized in manufacturing (e.g., to manipulate component parts or recognize defective component parts for a product) or in transportation (e.g., semantic segmentation of driving scenes and automatic operation of a vehicle to reach a waypoint or destination).

In the illustrated embodiment, the autonomous system 600 includes a memory device 601 (e.g., non-volatile memory, such as read-only memory ("ROM"), programmable ROM ("PROM"), erasable programmable ROM ("EPROM"), electrically erasable programmable ROM "EEPROM"), flash memory, etc.), a processor or a processing circuit 602, a controller 603, and at least one sensor 604. The memory device 601, the processor or processing circuit 602, the controller 603, and the at least one sensor 604 may communicate with each other over a system bus 605. In one or more embodiments in which the autonomous system 600 is configured to control an autonomous or semi-autonomous vehicle, the sensors 604 may be any suitable type or kind of sensors configured to detect objects or situations in a path of the autonomous vehicle, such as one or more cameras, lidars, and/or radars, and the controller 603 may be connected to any suitable vehicle components for controlling the vehicle, such as brakes, the steering column, and/or the accelerator, based on the objects or situations detected by the one or more sensors 604.

In one or more embodiments, the memory device 601 is programmed with instructions which, when executed by the processor or processing circuit 602, cause the processor or processing circuit 602 to perform each of the tasks described above with reference to the flowchart depicted in FIG. 9. Alternatively, the processor or processing circuit 602 may be configured to execute instructions retrieved from an online data storage unit such as in "Cloud" computing and the online data storage unit may include the artificial neural network.

Additionally, in one or more embodiments, the memory device 601 is programmed with an artificial neural network configured to perform one or more tasks for operating or controlling the device into which the autonomous system 600 is installed. In one or more embodiments, the artificial neural network may be stored in an online data storage unit (e.g., in the "cloud") and accessible by the processor or processing circuit 602.

In one or more embodiments, the memory device 601 or the online data storage unit is programmed with instructions (i.e., software) which, when executed by the processor or processing circuit 602, cause the processor or processing circuit 602 to train the artificial neural network to perform a first task A (e.g., semantic segmentation of an image captured by one of the sensors 604, such as a daytime image captured by a camera).

Additionally, in one or more embodiments, the memory device 601 or the online data storage unit is programmed with instructions which, when executed by the processor or processing circuit 602, cause the processor or processing circuit 602 to calculate or determine the neurons of the artificial neural network that are significant for the performance of the first task A (i.e., the task-significant neurons in the artificial neural network). In one or more embodiments, the instructions include an EBP or a c-EBP algorithm.

In one or more embodiments, the memory device 601 or the online data storage unit is programmed with instructions which, when executed by the processor or processing circuit 602, cause the processor or processing circuit 602 to determining the importance of the synapses between the neurons for the performance of the first task A for which the artificial neural network was trained (i.e., identify attention-based synaptic importance for the performance of the first task A). In one or more embodiments, the instructions for determining the importance of the synapses may be a Hebbian learning algorithm (e.g., Equation 3 above) or Oja's learning algorithm (e.g., Equation 4 above).

Additionally, in one or more embodiments, the memory device 601 or the online data storage unit is programmed with instructions which, when executed by the processor or processing circuit 602, cause the processor or processing circuit 602 to rigidify the important synapses of the artificial neural network. Rigidifying the important synapses may include causing the weights associated with those important synapses to remain fixed or substantially fixed (i.e., remain constant or substantially constant) when the artificial neural network is trained on one or more new tasks. Alternatively, rigidifying the important synapses may include causing those weights associated with the important synapses not to remain fixed, but to be allocated relatively less plasticity than the synapses that are not important for the performance of the first task A. As described above, rigidifying the synapses associated with the important neurons is configured to cause the artificial neural network to exhibit selective plasticity without catastrophic forgetting. In one or more embodiments, the instructions for rigidifying the important synapses may include an algorithm for regularizing the loss function of the artificial neural network (e.g., Equation 5 above).

Additionally, in one or more embodiments, the memory device 601 or the online data storage unit is programmed with instructions which, when executed by the processor or processing circuit 602, cause the processor or processing circuit 602 to train the artificial neural network on a second task B different than the first task A (e.g., semantic segmentation of an image captured by one of the sensors 604, such as a nighttime image captured by a camera). Due to the rigidification of the important synapses of the artificial neural network, the artificial neural network is configured to learn the second task B without catastrophic forgetting of the first task A, as shown, for instance, in FIGS. 12-15.

In one or more embodiments, the memory device 601 or the online data storage unit is programmed with instructions which, when executed by the processor or processing circuit 602, cause the processor or processing circuit 602 to operate the controller 603 to control the device 700 in which the autonomous system 600 is incorporated in accordance with the tasks that the artificial neural network is trained to perform. For instance, in one or more embodiments in which the autonomous system 600 is incorporated into an autonomous vehicle (i.e., the device 700 is an autonomous vehicle), the instructions may cause the processor or processing circuit 602 to actuate the controller 603 to control the steering, braking, and or acceleration of the vehicle (e.g., to avoid one or more hazardous objects or conditions classified during semantic segmentation of a daytime driving scene, a nighttime driving scene, or a rainy driving scene captured by the one or more sensors 604).

Figure 17:
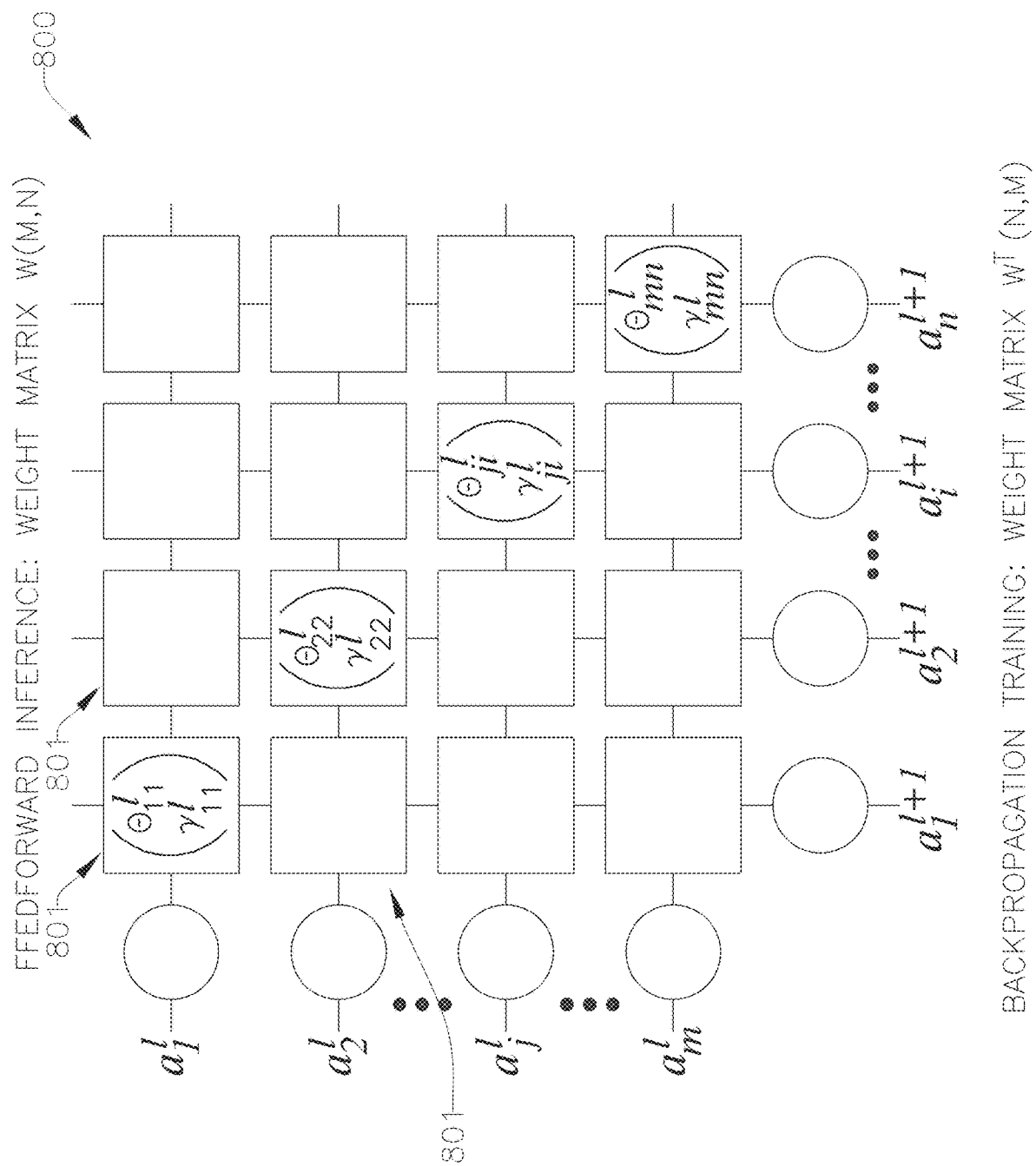

FIG. 17 depicts a schematic view of a neuromorphic memory circuit 800 configured to perform multiply-accumulate (MAC) operations for an artificial neural network. In the illustrated embodiment, the neuromorphic memory circuit 800 includes a series of cells 801 arranged in a cross-bar array (i.e., a series of cells 801 arranged in rows and columns). The cells 801 may be arranged in a two-dimensional array or a quasi-three-dimensional array. The cells 801 represent synaptic connections between individual neurons a in adjacent layers of the artificial neural network. In the illustrated embodiment, the cells 801 depict all-to-all connections between the neurons in adjacent layers (e.g., adjacent hidden layers) of the artificial neural network, although in one or more embodiments, the cells 801 may represent a more sparsely connected artificial neural network. A cross-bar architecture allows all-to-all connections between neurons (nodes) in adjacent layers. Sparse connection can be achieved by setting most of the cells in the cross-bar array at large enough resistance values (or small enough synaptic weights). In FIG. 17 $a_1^l$ represents the first neuron, $a_1$ in the first layer, l, of the artificial neural network, and $a_1^{l+1}$ represents the first neuron, $a_1$ in the second layer, l+1, of the artificial neural network.

Each cell 801 stores two hyperparameters, a synaptic weight value θ and a synaptic importance value γ. The hyperparameters (i.e., the synaptic weight value θ and the synaptic importance value γ) are stored in non-volatile memory elements. In FIG. 17, $\theta_{m,n}^l$ refers to the synaptic weight of the synapse connecting the m'th neuron in the l'th layer ($a_m^l$) to the n'th neuron in the l+1'th layer ($a_n^{l+1}$). Additionally, in FIG. 17 $\gamma_{m,n}^l$ refers to the synaptic importance of the synapse connecting the m'th neuron in the l'th layer ($a_m^l$) to the n'th neuron in the l+1'th layer ($a_n^{l+1}$).

Figure 18A:
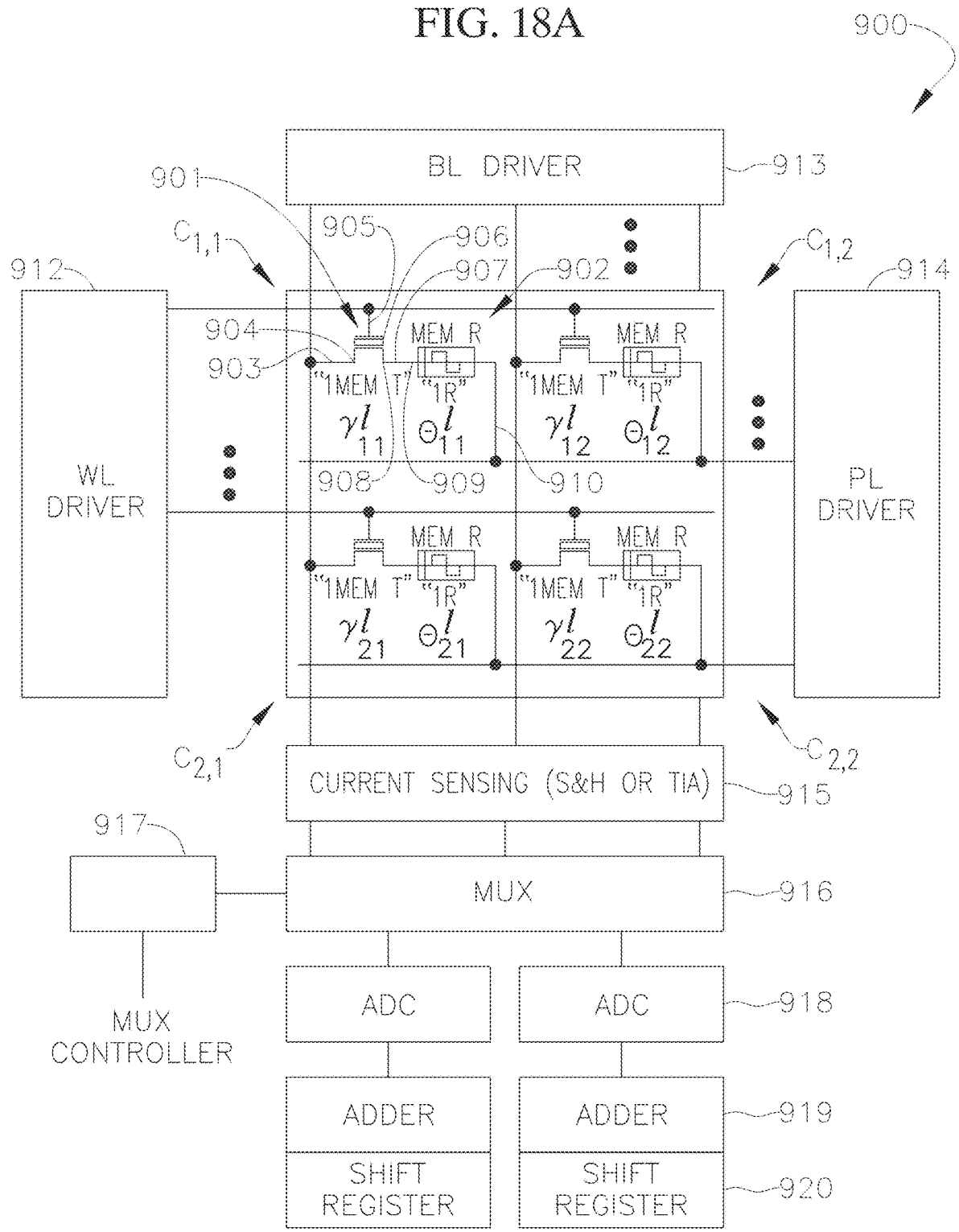
Figure 18B:
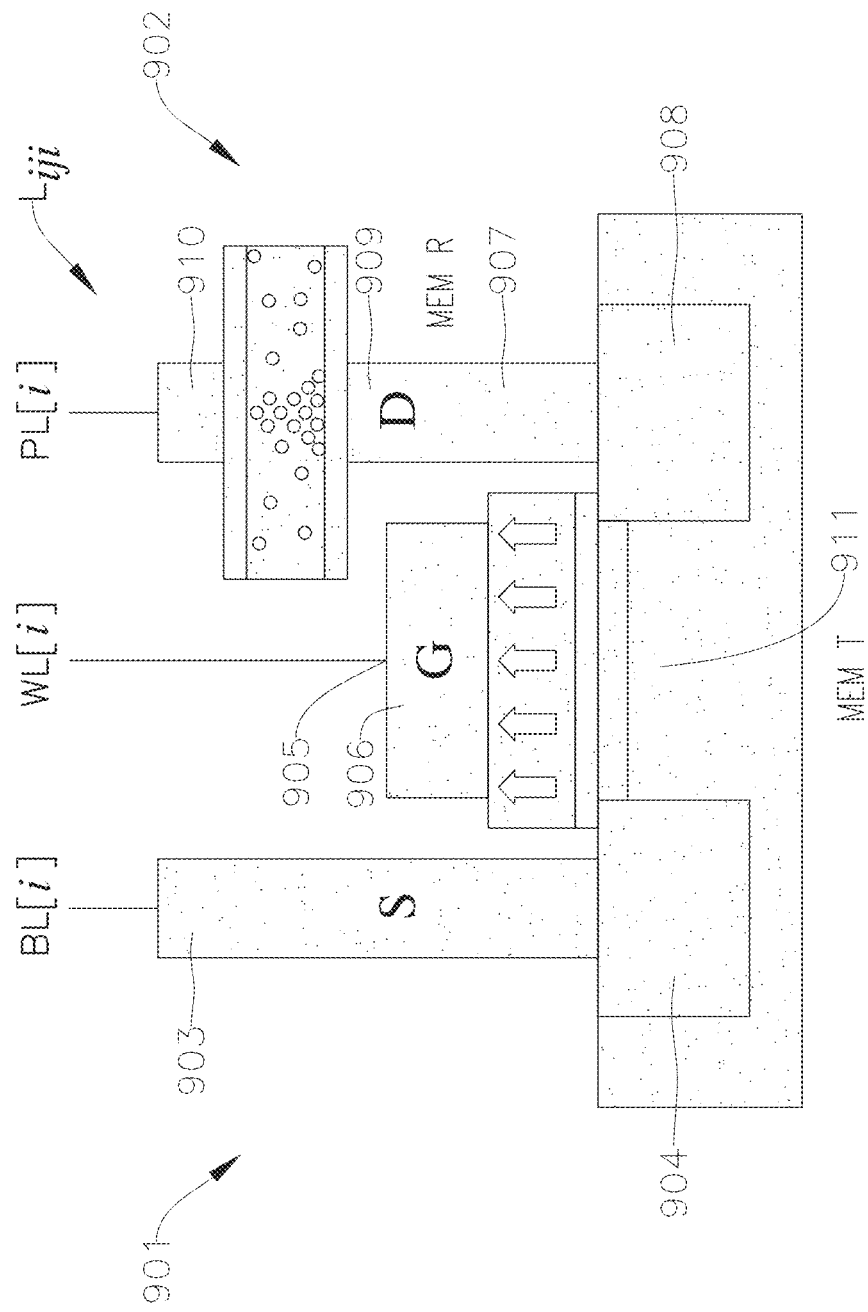
FIG. 18B is a schematic view of a memory transistor and a memristor in each cell of the neuromorphic memory circuit illustrated in FIGS. 17-18A.

With reference now to FIG. 18A, a neuromorphic memory circuit 900 configured to perform multiply-accumulate (MAC) (e.g., matrix-vector multiplication (MVM)) operations for an artificial neural network according to one embodiment of the present disclosure includes a series of cells $C_{i,j}$ connected together in a cross-bar array (i.e., a series of rows and columns), where i refers to the i'th row and j refers to the j'th column of the cross-bar array. The neuromorphic memory circuit 900 may be utilized as a hardware implementation of an artificial neural network configured to exhibit selective plasticity. In the illustrated embodiment, each cell $C_{i,j}$ includes a memory transistor 901 connected in series to a memristor 902. The memory transistor 901 is a three-terminal transistor including a source terminal 903 connected to a source 904 of the memory transistor 901, a gate terminal 905 connected to a gate 906 of the memory transistor 901, and a drain terminal 907 connected to a drain 908 of the memory transistor 901. The memristor 902 includes an input terminal 909 and an output terminal 910. The drain terminal 907 of the memory transistor 901 is connected to the input terminal 909 of the memristor 902. FIG. 18B depicts the memory transistor 901 and the memristor 902 in each of the cells $C_{i,j}$.

The memory transistor 901 in each cell $C_{i,j}$ may be a ferroelectric field-effect transistor (FeFET) (i.e., a ferroelectric capacitor connected to an underlying field-effect transistor) or a charge trap transistor (CTT) (i.e. a field-effect transistor that has a programmable amount of charges trapped in its gate dielectric to control its current-voltage characteristics). In one or more embodiments in which the memory transistor 901 in each cell $C_{i,j}$ is a FeFET, each FeFET may include a channel 911 formed of c-Si (monocrystalline silicon), α-IGZO (amorphous indium gallium zinc oxide, InGaZnO), or poly-chalcogenide (polycrystalline chalcogenide, e.g., germanium tin, GeSn), and a gate dielectric formed of HZO (hafnium zirconium oxide, HfZrOx) or ferroelectric $HfO_2$ (hafnium oxide). In one or more embodiments in which the memory transistor 901 in each cell $C_{i,j}$ is a CTT, each CTT may include a channel formed of c-Si (monocrystalline silicon) or α-IGZO (amorphous indium gallium zinc oxide, InGaZnO), and charge traps formed of oxygen vacancies ($Vo^{++}$) or metal nanoparticles (NPs). The memristor 902 in each cell $C_{i,j}$ may be a resistive random access memory (ReRAM) element, a phase-change memory (PCM) element, a ferroelectric tunnel junction (FTJ) element, or a spin-transfer torque memory (STT-RAM) element.

In the illustrated embodiment, the neuromorphic memory circuit 900 also includes a series of input lines (bit lines) BL[j] (where j refers to the column of the cross-bar array) connected to the source terminal 903 of the memory transistor 901 in each cell $C_{i,j}$, a series of output lines (plate lines) PL[i] (where i refers to the row of the cross-bar array) connected to the output terminal 910 of the memristor 902 in each cell $C_{i,j}$, and a series of programming lines (word lines) WL[i] (where i refers to the row of the cross-bar array) coupled to the gate terminal 905 of the memory transistor 901 in each cell $C_{i,j}$.

Additionally, in the illustrated embodiment, the neuromorphic memory circuit 900 includes word line (WL) driver 912 coupled to the programming lines WL[i], a bit line (BL) driver 913 coupled to the input lines, BL[j] and a plate line (PL) driver 914 coupled to the output lines PL[i]. Furthermore, in the illustrated embodiment, the neuromorphic memory cell 900 includes a current sensing element 915 coupled to the cross-bar array. The current sensing element 915 may be a sample and hold (S&H) circuit or trans-impedance amplifiers (TIA). The neuromorphic memory circuit 900 in the illustrated embodiment also includes a multiplexer (MUX) 916, a MUX controller 917 coupled to the MUX 916, a series of analog-to-digital converters (ADCs) 918 coupled to the MUX 916, and a series of adders 919 and shift registers 920 coupled to the MUX 916 via the ADCs 918. In one or more embodiments, one or more of the ADCs 918 may be shared by two or more columns of the cross-bar array to achieve energy and area savings.

In each cell $C_{i,j}$ of the neuromorphic memory circuit 900, the memristor 902 is configured to store, in non-volatile memory, a conductance value representative of a synaptic weight of a synapse connecting two neurons in adjacent layers of the artificial neural network, and the memory transistor 901 is configured to store, in non-volatile memory, a threshold voltage ($V_T$) representative of a synaptic importance of the synapse for performing a particular task (e.g., image classification or semantic segmentation). For an n-channel FeFET (n-FeFET), shifting $V_T$ toward a more positive value would decrease the source-drain current at the same source-drain bias. A higher synaptic importance corresponds to a more positive $V_T$, which blocks the current flow through the FeFET, thus preventing a change in the resistance (weight) of the memristor element connected in series with the FeFET. In FeFET, $V_T$ can be programmed (adjusted) by changing the polarization of the ferroelectric gate dielectric. Accordingly, each cell $C_{i,j}$ of the neuromorphic memory circuit 900 is configured to store two hyperparameters. In FIG. 18A, $\theta_{1,1}^l$ refers to the synaptic weight of the synapse connecting the first neuron in the first layer ($a_1^l$) to the first neuron in the second layer ($a_1^{l+1}$), $\theta_{1,2}^l$ refers to the synaptic weight of the synapse connecting the first neuron in the first layer ($a_1^l$) to the second neuron in the second layer ($a_2^{l+1}$), $\theta_{2,1}^l$ refers to the synaptic weight of the synapse connecting the second neuron in the first layer ($a_1^l$) to the first neuron in the second layer ($a_1^{l+1}$), and $\theta_{2,2}^l$ refers to the synaptic weight of the synapse connecting the second neuron in the first layer ($a_2^l$) to the second neuron in the second layer ($a_2^{l+1}$). Additionally, in FIG. 18A, $\gamma_{1,1}^l$ refers to the synaptic importance of the synapse connecting the first neuron in the first layer ($a_1^l$) to the first neuron in the second layer ($a_1^{l+1}$), $\gamma_{1,2}^l$ refers to the synaptic importance of the synapse connecting the first neuron in the first layer ($a_1^l$) to the second neuron in the second layer ($a_2^{l+1}$), $\gamma_{2,1}^l$ refers to the synaptic importance of the synapse connecting the second neuron in the first layer ($a_2^l$) to the first neuron in the second layer ($a_1^{l+1}$), and $\gamma_{2,2}^l$ refers to the synaptic importance of the synapse connecting the second neuron in the first layer ($a_2^l$) to the second neuron in the second layer ($a_2^{l+1}$). Although FIG. 18A only depicts four (2×2) memory cells of the entire cross-bar array, in one or more embodiments, the cross-bar array may have any suitable size depending on the size of the artificial neural network (i.e., the number of hidden layers and the number of neurons in each layer). The weights of the synapses may be determined during training of the artificial neural network to perform a first task, and the synaptic importance of the synapses may be determined, after the training of the artificial neural network to perform the first task, based on the significance of the synapses for performing the first task. The weights of the synapses and the synaptic importance values of the synapses may be calculated or determined in a circuit (e.g., a CMOS processing core) separate from the neuromorphic memory circuit 900. In one or more embodiments, the importance of the synapses may be determined in the manner described above. For instance, in one or more embodiments, the synaptic importance values may be calculated or determined utilizing a Hebbian learning algorithm (e.g., Equation 3 above). In one or more embodiments, the synaptic importance values may be calculated or determined utilizing Oja's learning rule (Equation 4 above).

After the synaptic weights and the synaptic importance values have been calculated in the manner described above, these values may be stored in the neuromorphic memory circuit 900 in the following manner. As described in more detail below, for each cell $C_{i,j}$ of the cross-bar array, the memory transistor 901 and the memristor 902 may be programmed independently (i.e., the threshold voltage ($V_T$) of the memory transistor 901 may be set or programmed independently of the conductance value of the memristor 902, and the conductance value of the memristor 902 may be set or programmed independently of the threshold voltage ($V_T$) of the memory transistor 901). The conductance values of the memristors 902 (which are representative of the synaptic weights) may be individually programmed (addressed) by setting the voltage to the desired level across the input line (bit line) BL[j] and the output line (plate line) PL[i] corresponding to the desired cell $C_{i,j}$ of the cross-bar array. For instance, to program the weight $\theta_{1,1}^l$ of the memristor in the cell $C_{1,1}$ corresponding to the synaptic connection between the first neuron in the first layer (at) to the first neuron in the second layer ($a_1^{l+1}$), a single voltage pulse having a programmable amplitude or duration, or a train of constant-amplitude and duration voltage pulses having a programmable number of pulses, may be applied across the first input line BL[1] and the first output line PL[1] to set the memristor conductance to a desired value.

In one or more embodiments in which the memory transistors 901 are FeFETs, the threshold voltage ($V_T$) of the memory transistor 901 in one of the cells $C_{i,j}$ may be programmed by applying a programming pulse across the gate terminal 905 and the source terminal 903 of the memory transistor 901 in the at least one cell $C_{i,j}$. Additionally, during the task of programming the threshold voltage ($V_T$) of the memory transistor 901, the conductance value of the memristor 902 may not be disturbed by setting the respective input line (BL line) BL[j] and the respective output line (PL line) PL[i] at the same voltage level. For instance, to program the importance value $\gamma_{1,1}^l$ of the memory transistor 901 in the cell $C_{1,1}$ corresponding to the synaptic connection between the first neuron in the first layer (a) to the first neuron in the second layer ($a_1^{l+1}$), a programming pulse may be applied across the gate terminal 905 and the source terminal 903 of the memory transistor 901 (i.e., applying a programming pulse across the first programming line WL[1] and the first input line BL[1]), and the first input line BL[1] and the first output line PL[1] may be set to the save voltage level to prevent overwriting the conductance value of the memristor 902 in the cell $C_{1,1}$.

Following the task of programming the synaptic weights and the synaptic importance values, the artificial neural network may be trained on a second task different than the first task and the weights of the synapses may be updated accordingly. These updated weights may then be stored in the neuromorphic memory circuit 900. However, in one or more embodiments, the threshold voltage applied to the memory transistor 901 in at least one cell $C_{i,j}$ is configured to prevent the conductance of the memristor 902 of the same cell $C_{i,j}$ from being changed (i.e., updated). That is, the synaptic importance value stored in the memory transistor 901 of at least one of the cells $C_{i,j}$ is configured to prevent the conductance value (synaptic weight) of the corresponding memristor 902 from being updated based on the weights calculated during the training of the artificial neural network on the second task (i.e., the threshold voltage of the memory transistor 901 in one of the cells $C_{i,j}$, which corresponds to the synaptic importance value, may be set such that the memory transistor 901 blocks the write/update operation of the memristor 902 in the same cell $C_{i,j}$, thereby preserving its synaptic weight from being lost when the artificial neural network is learning a new task). In this manner, the synaptic weights of the synapses that are important for the performance of the first task are not reprogrammed (i.e., overwritten) based on the weights of the synapses that are calculated during the process of training the artificial neural network on the second task, which is configured to prevent the artificial neural network from exhibiting catastrophic forgetting with respect to the performance of the first task.

Figure 19:
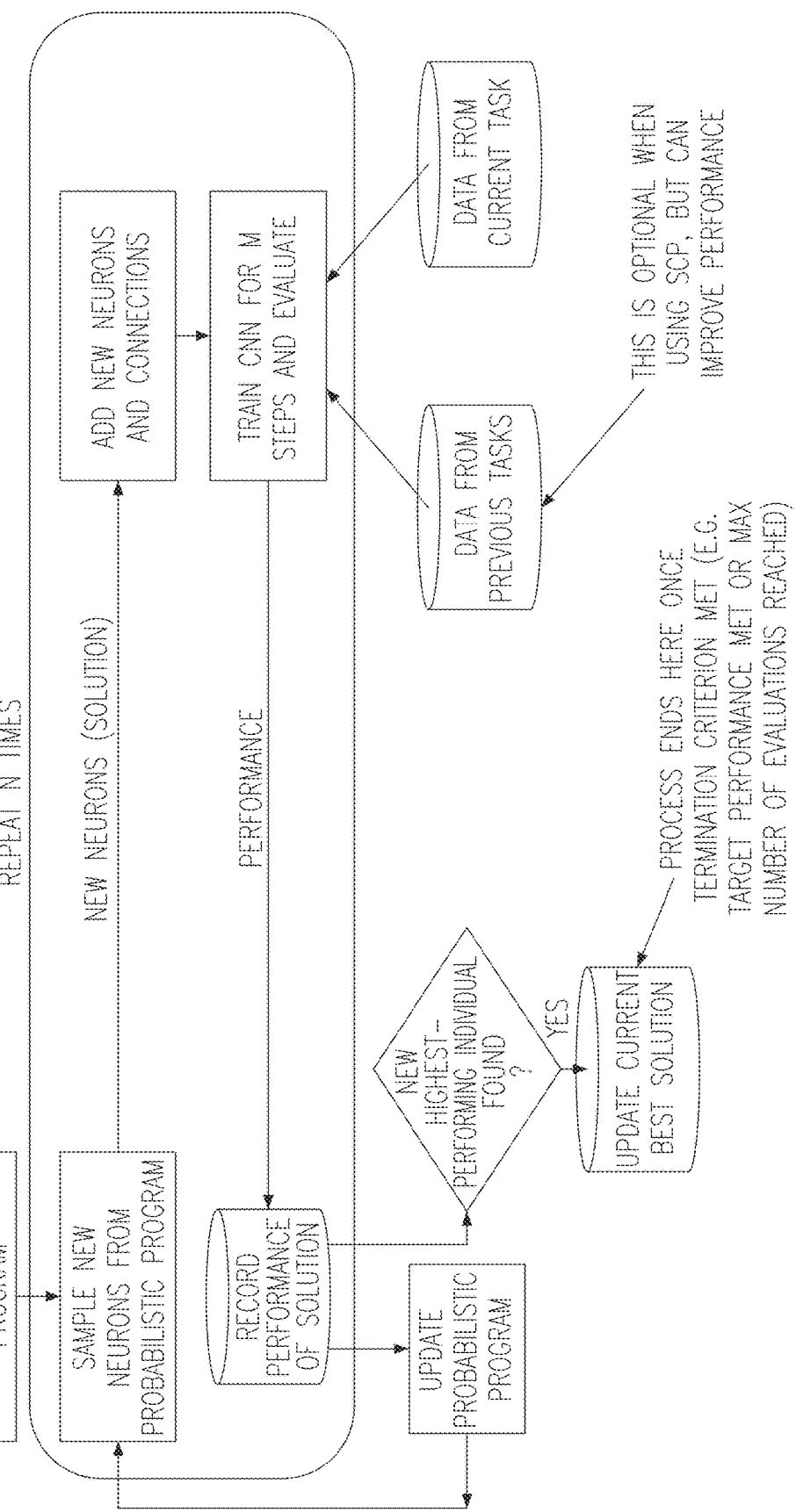
FIG. 19 is a schematic system architecture diagram according to one embodiment of the present disclosure.
Figure 20:
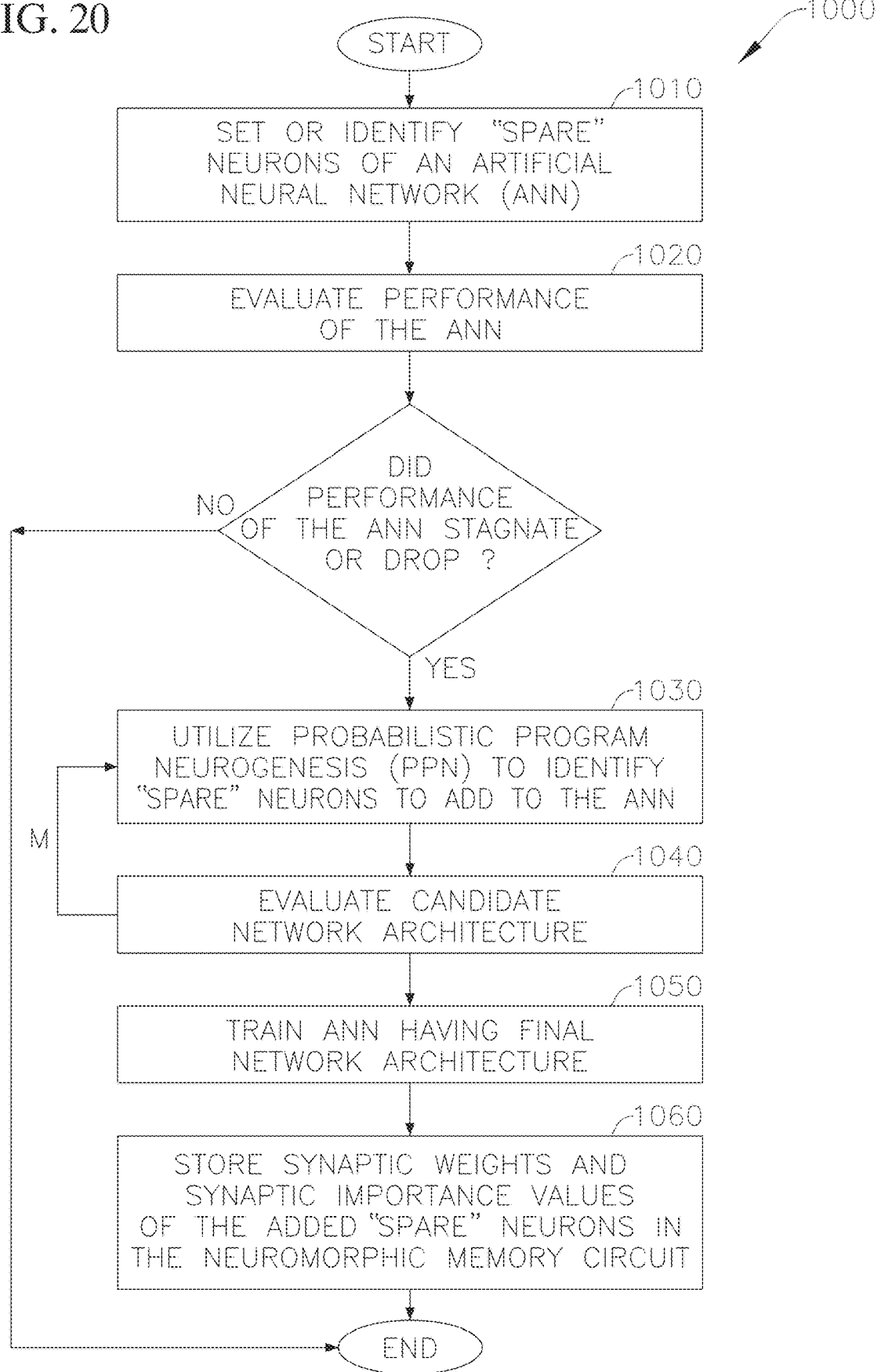
FIG. 20 is a flowchart illustrating tasks of a method of neurogenesis according to one embodiment of the present disclosure.

FIG. 19 is a schematic diagram of a system for enabling neurogenesis (i.e., the addition of neurons and associated synapses to an artificial neural network when the performance gains on a new task or context stagnate or decline due to the artificial neural network's limited learning capacity). FIG. 20 is a flowchart illustrating tasks of a method 1000 of neurogenesis for an artificial neural network.

In the illustrated embodiment, the method 1000 includes a task 1010 of setting or identifying "spare" neurons in the artificial neural network (i.e., the task may include tagging or labeling "spare" neurons). The "spare" neurons are those neurons of the artificial neural network that are not utilized for the performance of the artificial neural network in a first task or context, but may be utilized to augment performance of the artificial neural network by adding these neurons and their associated synaptic connections. That is, the "spare" neurons provide redundancy or additional network learning capacity that may be introduced on-demand. In one or more embodiments, the task 1010 may include training the artificial neural network on a first task or in a first context to determine the weights of the synapses connecting the neurons of the artificial neural network, and identifying the "spare" neurons based on the synaptic importance of the synapses connected to the neurons. The synaptic importance of the synapses may be determined or calculated utilizing a Hebbian learning algorithm (e.g., Equation 3 above) or utilizing Oja's learning rule (Equation 4 above). In one or more embodiments, the task 1010 may include labeling or tagging a neuron as a "spare" neuron if all of the synapses connected to that neuron have a synaptic importance value less than a threshold value (e.g., a preset threshold value). For instance, in one or more embodiments, the task 1010 may include labeling or tagging each neuron for which the synaptic importance value of each of the synapses connected to that neuron is more than three standard deviations less than the average synaptic value of the synapses in the same layer of the artificial neural network (i.e., each neuron that satisfies the following inequality will be tagged or labeled as a "spare" neuron: $\gamma_i < \text{Mean}(\gamma_i) - 3\text{Std.Dev.}(\gamma_i)$, where $\gamma_i$ is the synaptic importance of the synapses connected to the neurons in layer i of the artificial neural network). The "spare" neurons may be stored in the neuromorphic memory circuit illustrated in FIG. 18 by activating in-line switches in front of the cells $C_{i,j}$ in the neuromorphic memory circuit 900 corresponding to the "spare" neurons (i.e., the "spare" neurons may be stored in the neuromorphic memory circuit 900 by disconnecting the cells $C_{i,j}$ corresponding to the "spare" neurons from the neuromorphic memory circuit 900).

In one or more embodiments, the artificial neural network may utilize all synapses available in the training stage such that none of the neurons satisfy the equation above (i.e., for each neuron, at least one synapse connected to that neuron has a sufficiently high importance value (a value exceeding the preset threshold value) that none of the neurons in the artificial neural network can be labeled or tagged as a "spare" neuron according to the method described above). Accordingly, in one or more embodiments, the task 1010 may include intentionally setting some of the neurons of the artificial neural network as "inactive."

Figure 21:
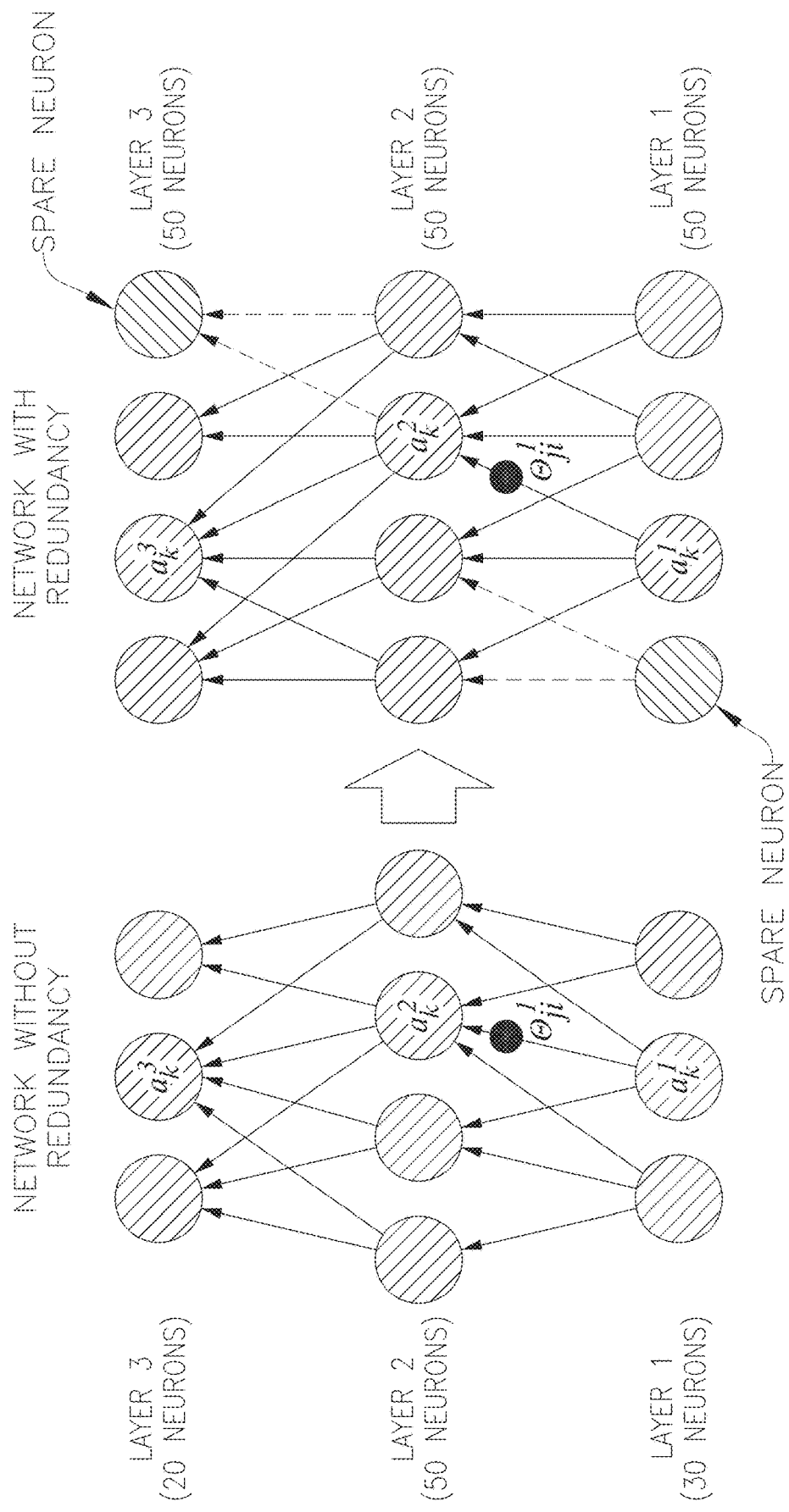
FIG. 21 is a schematic view of an artificial neural network having "spare" neurons according to one embodiment of the present disclosure.

FIG. 21 depicts an embodiment of an artificial neural network including a "spare" neuron in a first layer ("Layer 1") and a "spare" neuron in a third layer ("Layer 3). FIG. 21 also depicts synaptic connections between the "active" neurons in solid arrows, and synaptic connections to the "inactive" or "spare" neurons in dashed arrows. The "active" neurons and their associated synaptic connections (solid arrows) are the current network architecture after training for previous tasks, and the "spare" neurons and their associated synaptic connections (dashed arrows) are spare (redundant) ones reserved for learning new tasks if needed. Although in the illustrated embodiment the artificial neural network has only three layers and 50 neurons in each layer, in one or more embodiments, the artificial neural network may have any other suitable number of layers and each layer may include any suitable number of neurons.

In the illustrated embodiment, the method 1000 also includes a task 1020 of evaluating the performance of the artificial neural network on a new task or in a new context. In one or more embodiments, the task includes determining if the performance of the artificial neural network on the new task or context stagnates or decreases (e.g., the performance gains of the artificial neural network in the context of performing the new task or in the new context stagnate or decline due to saturation of the limited learning capacity of the artificial neural network).

In the illustrated embodiment, if the performance of the artificial neural network has stagnated or decreased (as determined in task 1020), the method 1000 includes a task 1030 of determining the number and location of "spare" neurons, and their associated synaptic connections, to be added to the artificial neural network (i.e., the task 1030 includes determining which of the "spare" neurons and their associated synaptic connections, set or determined in task 1010, to be "activated"). In one or more embodiments, the task 1030 of determining the number and location of "spare" neurons to be added to the artificial neural network may utilize the probabilistic program neurogenesis (PPN) algorithm described above (e.g., the method 100 illustrated in FIG. 1). The PPN algorithm utilizes a global search approach to select or determine a candidate network architecture in the network architecture space (i.e., the task 1030 includes utilizing the PPN algorithm to select a candidate network architecture in the probabilistic population). The PPN algorithm utilizes a tournament selection and "hall of fame" approach to identify the best-performing network architecture, and then the parameters of the probabilistic program are updated so that the probabilistic distribution of the network architecture is more likely to sample from good regions in the search space. The task 1030 of determining the number and location of "spare" neurons and synapses to be added to the artificial neural network utilizing the PPN algorithm may be performed utilizing a commercial off-the-shelf (COTS) chip (e.g., a CMOS microprocessor separate from the neuromorphic memory circuit 900).

In the illustrated embodiment, following the task 1030 of selecting or determining a candidate network architecture utilizing the PPN algorithm (i.e., determining the number and location of "spare" neurons and synapses to be added to the artificial neural network), the method 1000 includes a task 1040 of evaluating the performance of the candidate network architecture in the context of a new task or context. In the illustrated embodiment, the task 1040 of evaluating the performance of the candidate network architecture includes partially training the artificial neural network for certain steps (M) and evaluating the performance of the candidate network architecture utilizing data from the current task or context (i.e., the new task or context). In one or more embodiments, in task 1040, the performance of the candidate network architecture may, optionally, also utilize data from one or more previous tasks. In one or more embodiments, in task 1040, the performance of the candidate network architecture may be evaluated utilizing a fitness function. For classification tasks, the fitness of the candidate artificial neural network is proportional to accuracy, but the fitness is reduced by the complexity of the candidate network architecture, which is given by the number of new neurons (i.e., the number of "spare" neurons that are "activated") divided by the number of "activated" neurons in the parent artificial neural network (i.e., the number of "activated" neurons in the artificial neural network during performance of the previous task), as follows:

$$\text{Fitness} = k*\text{accuracy} - \text{complexity}$$

In the illustrated embodiment, the task 1030 of determining the candidate network architecture utilizing the PPN algorithm and the task 1040 of evaluating the performance of that candidate network architecture may be performed iteratively (N times) to determine or identify a final network architecture that achieves or exhibits the best performance for the new task or context (e.g., the optimal or near-optimal network architecture). FIG. 22 is a schematic diagram depicting utilizing PPN to efficiently search the space of network architectures to identify candidate network architectures (i.e., identifying important synapses of the artificial neural network for performing a first task and a second task) and evaluating the performance (e.g., fitness) of the candidate network architecture to identify the new network architecture (i.e., the number and locations of the "spare" neurons and synapses to activate or add to the artificial neural network). In FIG. 22, the contour lines represent a gradient, the dots represent the network architectures of the artificial neural network that were explored by the PPN algorithm, and the minimum point shown in darker shading represents the optimal network architecture of the artificial neural network for performing a first task and a second task, as identified by the PPN algorithm in tasks 1030 and 1040.

In the illustrated embodiment, after the final network architecture (e.g., the optimal or near-optimal network architecture) is identified by iteratively performing tasks 1030 and 1040 (i.e., after determining the number and locations of the "spare" neurons to "activate" and connecting to the existing neurons in the artificial neural network), the method 1000 includes a task 1050 of fully training (e.g., in COTS hardware) the artificial neural network having the final network architecture on the new task or context to determine the synaptic weight(s) and the synaptic importance value(s) for each of the "spare" neurons and their associated synaptic connections that were added (i.e., "activated") to the artificial neural network.

In the illustrated embodiment, after the task 1050 of fully training the artificial neural network on the new task or context, the method 1000 includes a task 1060 of storing, in the neuromorphic memory circuit illustrated in FIGS. 17-18, the synaptic weights and the synaptic importance values of the "spare" neurons and their associated synapses that were added (i.e., activated) following tasks 1030 and 1040.

In this manner, the learning capacity of the artificial neural network may be expanded on-demand in response to the performance gains on a new task or new context stagnating or decreasing (i.e., the learning capacity of the artificial neural network becoming saturated), thereby overcoming the issue of intransigence associated with related art artificial neural networks having fixed network architecture, and which may be implemented in edge-computing hardware with limited size, weight, and power (SWaP) budgets.

The artificial neural network and/or any other relevant smart devices or components (e.g., smart aircraft or smart vehicle devices or components) according to embodiments of the present invention described herein may be implemented utilizing any suitable smart hardware, firmware (e.g. an application-specific integrated circuit), software, or a combination of software, firmware, and hardware. For example, the various components of the artificial neural network may be formed on one integrated circuit (IC) chip or on separate IC chips. Further, the various components of the artificial neural network may be implemented on a flexible printed circuit film, a tape carrier package (TCP), a printed circuit board (PCB), or formed on one substrate. Further, the various components of the artificial neural network may be a process or thread, running on one or more processors, in one or more computing devices, executing computer program instructions and interacting with other system components for performing the various smart functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims, and equivalents thereof.

What is claimed is:

1. A memory circuit configured to perform multiply-accumulate (MAC) operations for performance of an artificial neural network, the memory circuit comprising:
a plurality of synapse cells arranged in a cross-bar array, each cell of the plurality of cells comprising a memory transistor connected in series with a memristor;
a plurality of input lines connected to a source terminal of the memory transistor in each cell;
a plurality of output lines connected to an output terminal of the memristor in each cell; and
a plurality of programming lines coupled to a gate terminal of the memory transistor in each cell,
wherein the memristor of each cell is configured to store a conductance value representative of a synaptic weight of a synapse connected to a neuron of a plurality of neurons in the artificial neural network,
wherein the memory transistor of each cell is configured to store a threshold voltage representative of a synaptic importance value of the synapse connected to the neuron in the artificial neural network, and
wherein, for each cell of the plurality of cells, the conductance value of the memristor and the threshold voltage of the memory transistor are independently programmable.

2. The memory cell of claim 1, wherein the memristor in each cell of the plurality of cells is selected from the group consisting of a resistive random access memory (ReRAM) element, a phase-change memory (PCM) element, a ferroelectric tunnel junction (FTJ) element, and a spin-transfer torque memory (STT-RAM) element.

3. The memory cell of claim 1, wherein the memory transistor in each cell of the plurality of cells is selected from the group consisting of a ferroelectric field-effect transistor (FeFET) and a charge trap transistor (CTT).

4. The memory circuit of claim 1, further comprising:
a word line driver coupled to the plurality of programming lines;
a bit line driver coupled to the plurality of input lines; and
a plate line driver coupled to the plurality of output lines.

5. The memory circuit of claim 1, further comprising a current sensing element coupled to the cross-bar array.

6. The memory circuit of claim 5, wherein the current sensing element comprises sample and hold amplifiers or trans-impedance amplifiers.

7. The memory circuit of claim 5, further comprising:
a multiplexer coupled to the current sensing element; and
a multiplexer controller coupled to the multiplexer.

8. The memory circuit of claim 7, further comprising a plurality of analog-to-digital converters coupled to the multiplexer.

9. The memory circuit of claim 7, further comprising a plurality of adders and a plurality of shift registers, said plurality of adders and said plurality of shift registers coupled to a plurality of analog-to-digital converters.

10. A method of programming the memory circuit of claim 1, the method comprising:
changing the conductance value, representative of the synaptic weight, of the memristor in at least one cell of the plurality of cells during training of the artificial neural network on a first task;
determining, with a circuit separate from the memory circuit, at least one important synapse of the artificial neural network for performing the first task; and
changing the threshold voltage, representative of the synaptic importance value, of the memory transistor in at least one cell of the plurality of cells, the at least one cell corresponding to the at least one important synapse of the artificial neural network for performing the first task.

11. The method of claim 10, wherein the changing of the threshold voltage comprises:
applying a programming pulse across the gate terminal and the source terminal of the memory transistor in the at least one cell; and
applying a same voltage to the input lines and the output lines.

12. The method of claim 11, further comprising changing the conductance value, representative of the synaptic weight, of the memristor of at least one cell of the plurality of cells during training the artificial neural network on a second task different than the first task,
wherein the threshold voltage of the memory transistor of at least one cell is configured to prevent the changing of the weight value of the at least one cell during the training of the artificial neural network on the second task to prevent the neural network from exhibiting catastrophic forgetting.

13. The method of claim 10, wherein the circuit is integrated with CMOS circuitry.

14. The method of claim 10, wherein the determining of the at least one important synapse of the artificial neural network comprises:
identifying, utilizing a contrastive excitation backpropagation algorithm, important neurons of the plurality of neurons for the first task; and
identifying, utilizing a learning algorithm, important synapses between the plurality of neurons for the first task based on the important neurons identified.

15. The method of claim 14, wherein the learning algorithm to identify important synapses is a Hebbian learning algorithm as follows:

$$\beta_{ji}^{l} = \beta_{ji}^{l} + P(a_j^l(x_n))P(a_i^{l+1}(x_n)),$$

where $\beta_{ji}^{l}$ is a synaptic importance parameter, x is an input image, $a_j^l$ is a j'th neuron in an l'th layer of the artificial neural network, $a_i^{l+1}$ is an i'th neuron in layer l+1 of the artificial neural network, and P is a probability.

16. The method of claim 14, wherein the learning algorithm to identify important synapses is Oja's learning rule as follows:

$$\gamma_{ji}^{l} = \gamma_{ji}^{l} + \in (P_c(f_j^{(l-1)})P_c(f_i^l) - P_c(f_i^l)^2 \gamma_{ji}^l),$$

where i and j are neurons, l is a layer of the artificial neural network, $P_c$ is a probability, $\gamma_{ji}^{l}$ is the importance of the synapse between the neurons $f_j^{(l-1)}$ and $f_i^l$ for the first task, $\in$ is the rate of Oja's learning rule, and $P_c$ is a probability.

17. A method of performing neurogenesis of an artificial neural network comprising a plurality of layers and a plurality of neurons in each layer of the plurality of layers, the method comprising:
determining a plurality of spare neurons of the artificial neural network;
evaluating performance of the artificial neural network at a new task or context;
determining a number and locations of additional neurons of the plurality of spare neurons to add to the artificial neural network in response to the performance of the artificial neural network stagnating or declining;
connecting the additional neurons to the artificial neural network with additional synapses;
training the artificial neural network with the additional neurons and the additional synapses on the new task or context to determine weights and synaptic importance values of the additional synapses; and storing the weights and the synaptic importance values of the spare neurons in cells of the memory circuit of claim 1.

18. The method of claim 17, wherein the determining the spare neurons comprises:

training the artificial neural network on a first task or context to determine weights of synapses connecting the plurality of neurons;

determining synaptic importance values of the synapses; and determining that the synaptic importance value for each synapse connected to at least one neuron of the plurality of neurons is below a synaptic importance threshold.

19. The method of claim 18, wherein the synaptic importance threshold is determined according to Equation 1:

$$\gamma_i < \text{Mean}(\gamma_i) - 3\text{Std.Dev.}(\gamma_i) \qquad \text{(Equation 1)}$$

wherein $\gamma_i$ is the synaptic importance of the synapses connected to the plurality of neurons in layer i of the artificial neural network.

20. The method of claim 17, wherein the determining the spare neurons comprises actively setting the spare neurons inactive.

21. The method of claim 17, wherein the determining the number and the locations of the additional neurons utilizes a probabilistic program neurogenesis (PPN) algorithm executed on a commercial off-the-shelf (COTS) chip separate from the memory circuit of claim 1.

* * * * *